(12) United States Patent
Finck et al.

(10) Patent No.: US 11,626,555 B2
(45) Date of Patent: Apr. 11, 2023

(54) MODE-SELECTIVE COUPLERS FOR FREQUENCY COLLISION REDUCTION

(71) Applicant: International Business Machines Corporation, Armonk, NY (US)

(72) Inventors: Aaron Finck, White Plains, NY (US); John Blair, Katonah, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 215 days.

(21) Appl. No.: 16/895,677

(22) Filed: Jun. 8, 2020

(65) Prior Publication Data

US 2021/0384404 A1 Dec. 9, 2021

(51) Int. Cl.
| | |
|---|---|
| *H01L 39/22* | (2006.01) |
| *G06N 10/00* | (2022.01) |
| *H01L 39/02* | (2006.01) |

(52) U.S. Cl.
CPC .......... *H01L 39/223* (2013.01); *G06N 10/00* (2019.01); *H01L 39/025* (2013.01)

(58) Field of Classification Search
CPC ........................... H01L 39/223; H01L 39/025
See application file for complete search history.

(56) References Cited

U.S. PATENT DOCUMENTS 7,613,764 B1 11/2009 Hilton et al.
9,940,586 B1 4/2018 Epstein et al.
(Continued)

FOREIGN PATENT DOCUMENTS

WO 2015/178990 A2 11/2015
WO 2019126396 6/2019
(Continued)

OTHER PUBLICATIONS

Hazra et al. "Engineering Cross Reference Resonance Interaction in Multi-modal Quantum Circuits," arXiv:1912.10953 https://arxiv.org/abs/1912.10953 (Year: 2019).*
(Continued)

*Primary Examiner* — Matthew L Reames
(74) *Attorney, Agent, or Firm* — Amin, Turocy & Watson, LLP

(57) ABSTRACT

Systems and techniques that facilitate mode-selective couplers for frequency collision reduction are provided. In various embodiments, a device can comprise a control qubit. In various aspects, the device can comprise a first target qubit coupled to the control qubit by a first mode-selective coupler. In various instances, the first mode-selective coupler can facilitate A-mode coupling between the control qubit and the first target qubit. In various embodiments, the device can comprise a second target qubit coupled to the control qubit by a second mode-selective coupler. In various aspects, the second mode selective coupler can facilitate B-mode coupling between the control qubit and the second target qubit. In various embodiments, the first mode-selective coupler can comprise a capacitor that capacitively couples a middle capacitor pad of the control qubit to a middle capacitor pad of the first target qubit. In various embodiments, the second mode-selective coupler can comprise a first capacitor that capacitively couples an end capacitor pad of the control qubit to an end capacitor pad of the first target qubit and can comprise a second capacitor that capacitively couples the end capacitor pad of the control qubit to a middle capacitor pad of the second target qubit.

20 Claims, 11 Drawing Sheets

(56) References Cited

U.S. PATENT DOCUMENTS

| | | | |
|---|---|---|---|
| 10,176,432 B2 | 1/2019 | Abdo et al. | |
| 10,192,168 B2 | 1/2019 | Rigetti et al. | |
| 10,467,544 B2 | 11/2019 | Filipp et al. | |
| 2019/0296211 A1 | 9/2019 | Chow et al. | |
| 2019/0347576 A1 | 11/2019 | von Salis et al. | |

FOREIGN PATENT DOCUMENTS

| | | |
|---|---|---|
| WO | 2020036673 | 2/2020 |
| WO | 2020046928 | 3/2020 |

OTHER PUBLICATIONS

Gambetta et al., "A superconducting qubit with Purcell protection and tunable coupling," Phys. Rev. Lett. 106, 030502, arXiv:1009.4470v1 [cond-mat.mes-hall], 2011, 4 pages.

Ji et al., "Scalable nonadiabatic holonomic quantum computation on a superconducting qubit lattice," Phys. Rev. A 100, 062312; arXiv:1909.05768v2 [quant-ph], Dec. 11, 2019, 6 pages.

Rebic et al., "Giant-Kerr nonlinearities in Circuit-QED," Physical Review Letters 103(15), Sep. 2009, 5 pages.

Roy et al., "Implementation of pairwise longitudinal coupling in a three-qubit superconducting circuit," Phys. Rev. Applied 7, 054025, arXiv:1610.07915v1 [quant-ph], 2017, 16 pages.

Srinivasan et al. "Tunable coupling in circuit quantum electrodynamics with a superconducting V-system," Phys. Rev. Lett. 106, 083601, arXiv:1011.4317v1 [cond-mat.supr-con], 2011, 5 pages.

Gambetta et al., "Building logical qubits in a superconducting quantum computing system," NPJ Quantum Information 3, Article 3, 2017, 7 pages.

Chamberland et al., "Topological and Subsystem Codes on Low-Degree Graphs with Flag Qubits," Physical Review X 10, 011022, Jan. 31, 2020, 19 pages.

International Search Report and Written Opinion received for PCT Application Serial No. PCT/EP2021/063825, Dated Sep. 6, 2021, 11 pages.

Response dated Dec. 9, 2022 to Written Opinion dated Jun. 18, 2020 for EP Application No. 21728872.9, 5 pages.

Wolff, et al., "Quantum control in nearly non degenerate qubits interacting with light," https://doi.org/10.48550/arXiv.1607.02499, Dated: Aug. 25, 2016, 9 pages.

* cited by examiner

MODE-SELECTIVE COUPLERS FOR FREQUENCY COLLISION REDUCTION

BACKGROUND

The subject disclosure relates generally to superconducting qubits, and more specifically to mode-selective couplers for reducing frequency collisions among superconducting qubits.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that facilitate mode-selective couplers for frequency collision reduction are described.

According to one or more embodiments, a device is provided. In various aspects, the device can comprise a control qubit. In various instances, the device can further comprise a first target qubit. In various cases, the first target qubit can be coupled to the control qubit by a first mode-selective coupler. In various aspects, the first mode-selective coupler can facilitate A-mode coupling between the control qubit and the first target qubit. In various instances, the device can further comprise a second target qubit. In various aspects, the second target qubit can be coupled to the control qubit by a second mode-selective coupler. In various cases, the second mode-selective coupler can facilitate B-mode coupling between the control qubit and the second target qubit. In various embodiments, the first mode-selective coupler can comprise a capacitor. In various instances, the capacitor can capacitively couple a middle capacitor pad of the control qubit to a middle capacitor pad of the first target qubit. In various embodiments, the second mode-selective coupler can comprise a first capacitor and a second capacitor. In various aspects, the first capacitor can capacitively couple an end capacitor pad of the control qubit to an end capacitor pad of the second target qubit. In various instances, the second capacitor can capacitively couple the end capacitor pad of the control qubit to a middle capacitor pad of the second target qubit.

According to one or more embodiments, a method is provided. In various aspects, the method can comprise providing a control qubit. In various instances, the method can further comprise coupling the control qubit to a first target qubit by a first mode-selective coupler. In various instances, the first mode-selective coupler can facilitate A-mode coupling between the control qubit and the first target qubit. In various aspects, the method can further comprise coupling the control qubit to a second target qubit by a second mode-selective coupler. In various instances, the second mode-selective coupler can facilitate B-mode coupling between the control qubit and the second target qubit. In various embodiments, the first mode-selective coupler can comprise a capacitor. In various instances, the capacitor can capacitively couple a middle capacitor pad of the control qubit to a middle capacitor pad of the first target qubit. In various embodiments, the second mode-selective coupler can comprise a first capacitor and a second capacitor. In various cases, the first capacitor can capacitively couple an end capacitor pad of the control qubit to an end capacitor pad of the second target qubit. In various aspects, the second capacitor can capacitively coupler the end capacitor pad of the control qubit to a middle capacitor pad of the second target qubit.

According to one or more embodiments, an apparatus is provided. In various aspects, the apparatus can comprise a first mode-selective coupler that facilitates A-mode coupling between a control qubit and a first target qubit. In various aspects, the apparatus can further comprise a second mode-selective coupler that facilitates B-mode coupling between the control qubit and a second target qubit. In various embodiments, the first mode-selective coupler can comprise a capacitor. In various aspects, the capacitor can capacitively couple a middle capacitor pad of the control qubit to a middle capacitor pad of the first target qubit. In various embodiments, the second mode-selective coupler can comprise a first capacitor and a second capacitor. In various aspects, the first capacitor can capacitively couple an end capacitor pad of the control qubit to an end capacitor pad of the second target qubit. In various cases, the second capacitor can capacitively couple the end capacitor pad of the control qubit to a middle capacitor pad of the second target qubit.

DETAILED DESCRIPTION

Figure 1:
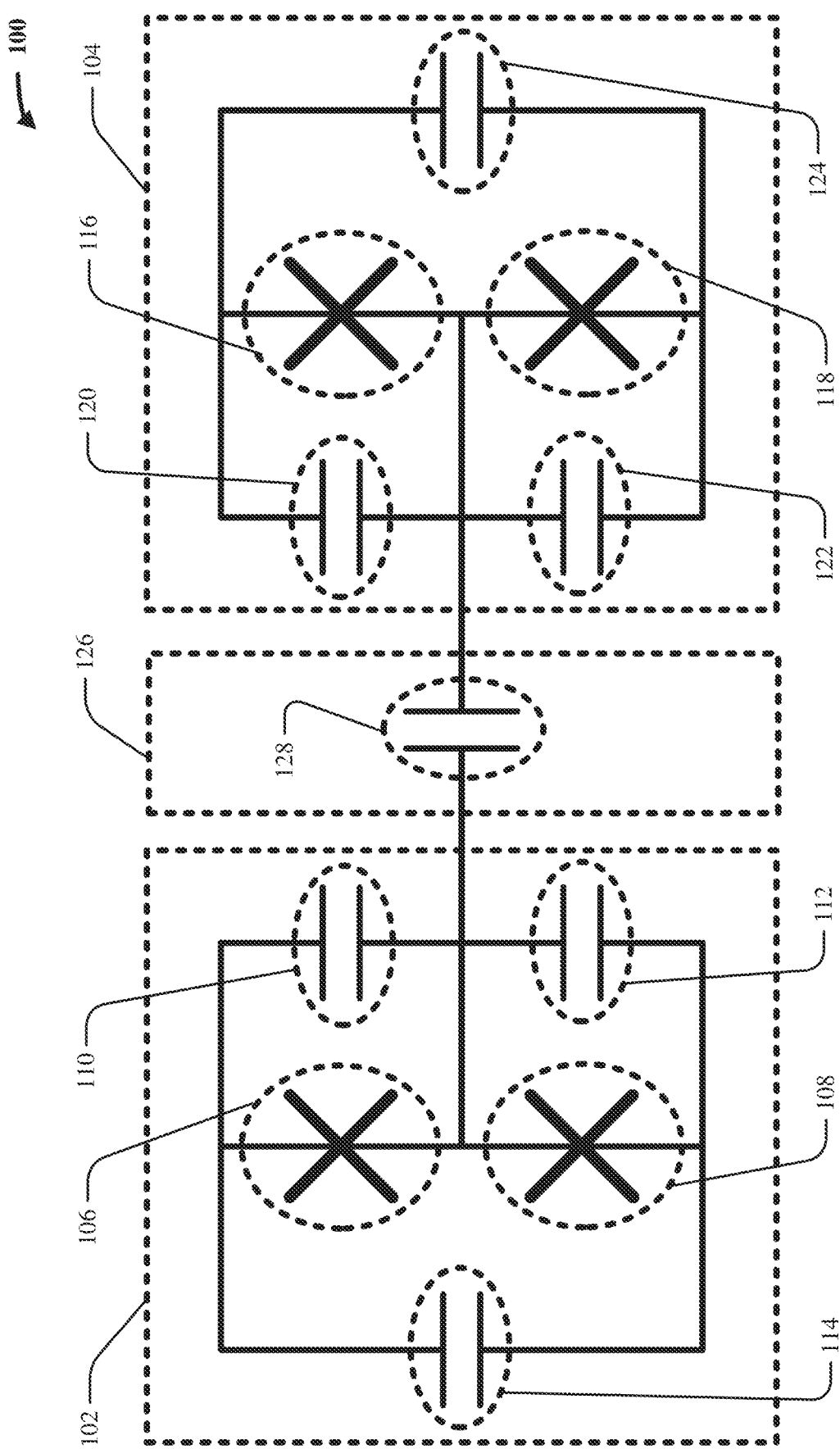
FIG. 1 illustrates a circuit diagram of an example, non-limiting system that facilitates A-mode coupling in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Superconducting qubits are a promising technology in the quest to build large-scale quantum computing systems. A superconducting qubit can, in various cases, include one or more Josephson junctions (e.g., macroscopic structures that can exhibit quantum mechanical behavior) that are shunted by one or more capacitors. In various instances, a quantum computing system can be formed based on a two-dimensional lattice of superconducting qubits (e.g., a quantum computing lattice) in which a pair of neighboring superconducting qubits can be coupled by a bus resonator (e.g., a microwave resonator). In various cases, a coupled pair of neighboring superconducting qubits can be entangled via a two-qubit gate called a cross-resonance gate. In various aspects, a cross-resonance gate can be implemented by driving one superconducting qubit, called a control qubit, with a microwave pulse and/or tone that is at the transition frequency (e.g., operational frequency and/or qubit frequency) of an adjacent and/or neighboring superconducting qubit, called a target qubit. In various instances, the control qubit can transmit a pulse and/or tone to the target qubit in response to being driven by the microwave pulse and/or tone. In various aspects, the amplitude of the pulse and/or tone that is transmitted from the control qubit to the target qubit can depend upon the state of the control qubit, thus entangling the two superconducting qubits. In other words, the target qubit can undergo qubit rotations the rate of which depend on the state of the control qubit.

In order to selectively entangle superconducting qubits, the neighbors of a control qubit (e.g., the target qubits) can have distinct (e.g., sufficiently separated) transition frequencies. For a nearest-neighbor-connected quantum computing lattice of superconducting qubits in which all superconducting qubits (e.g., except for those on the border/perimeter of the lattice) have four neighboring and/or adjacent superconducting qubits, five distinct transition frequencies can be required (e.g., four separate transition frequencies for the four target qubits, and a fifth transition frequency for the control qubit). In various cases, a quantum computing lattice can be formed from single-mode qubits; that is, where any superconducting qubit in the quantum computing lattice has a single transition frequency (e.g., a single-junction transmon). In various cases, such a lattice can require five distinctly fabricated sets of superconducting qubits in order to obtain the five distinct transition frequencies needed for selective entanglement (e.g., creating a lattice out of a first set of single-junction transmon qubits with a first transition frequency, a second set of single-junction transmon qubits with a second transition frequency, a third set of single-junction transmon qubits with a third transition frequency, a fourth set of single-junction transmon qubits with a fourth transition frequency, and a fifth set of single-junction transmon qubits with a fifth transition frequency). In various aspects, a quantum computing lattice can include dozens and/or hundreds of superconducting qubits. When many superconducting qubits are implemented, imperfections in nanofabrication techniques can make it difficult to reliably and/or consistently manufacture the five distinct sets of superconducting qubits (e.g., can make it difficult to keep all five sets of transition frequencies at their desired values). When two target qubits that are adjacent to and/or neighbors of a control qubit have similar transition frequencies, selective entanglement cannot be implemented between the control qubit and those target qubits. This can be known as a target-based frequency collision. In various aspects, target-based frequency collisions can negatively affect the performance of a quantum computing system.

For quantum computing lattices that include next-nearest-neighbor-connectivity in addition to nearest-neighbor-connectivity, more than five distinct transition frequencies can be required to facilitate selective cross-resonance entanglement (e.g., as many as nine distinct transition frequencies and thus nine distinct sets of superconducting qubits can be needed; one transition frequency for the control qubit, four distinct transition frequencies for the four nearest-neighbor target qubits, and four more distinct transition frequencies for the four next-nearest-neighbor target qubits). In such cases, target-based frequency collisions can be even more likely to occur.

Those of ordinary skill in the art will appreciate that what constitutes a frequency collision can depend upon implementation details and/or operating context of a quantum computing system. In various aspects, those having ordinary skill in the art will understand what threshold of similarity in transition frequencies can constitute a frequency collision and/or will understand what threshold of dissimilarity in transition frequencies can avoid a frequency collision.

Some approaches to reducing the number of target-based frequency collisions include reducing the connectivity of the quantum computing lattice (e.g., reducing the average number of neighbors for a typical qubit in the quantum computing lattice). A quantum computing lattice with such reduced connectivity, called a low-degree lattice, can be less likely to experience frequency collisions, but can also be less resilient to errors and can thus require the implementation of quantum error correction codes. In various aspects, systems and/or techniques for reducing frequency collisions without reducing lattice connectivity can be desirable.

Various embodiments of the invention can solve one or more of these technical problems. In various aspects, embodiments of the invention can provide for quantum computing lattice architectures that can reduce the statistical likelihood of frequency collisions without correspondingly reducing lattice connectivity. Specifically, in various aspects, embodiments of the invention can include creating a quantum computing lattice based on two-junction transmon qubits coupled by mode-selective couplers.

In various aspects, a two-junction transmon qubit can be a superconducting qubit that includes two capacitively-shunted Josephson junctions that are coupled in series (e.g., a two-junction transmon qubit can be formed by two single-junction transmon qubits connected and/or coupled in series). In other words, a two-junction transmon qubit can include a first Josephson junction and a second Josephson junction, where the first Josephson junction is serially coupled between a first capacitor pad and a second capacitor pad, and where the second Josephson junction is serially coupled between the second capacitor pad and a third capacitor pad. In various aspects, the second capacitor pad can be called a middle capacitor pad of the two-junction transmon qubit, and the first capacitor pad and the third capacitor pad can be called end capacitor pads of the two-junction transmon qubit. In various instances, a two-junction transmon qubit can support and/or exhibit two distinct excitation modes: an A-mode and a B-mode. In various aspects, these two distinct excitation modes can have two different spatial symmetries and/or two different transition frequencies (e.g., an A-mode transition frequency and a B-mode transition frequency). In various instances, a two-junction transmon qubit can be encoded in either the A-mode (e.g., and can thus have an A-mode transition frequency) or the B-mode (e.g., and can thus have a B-mode transition frequency). In various aspects, short microwave pulses can be used to switch a two-junction transmon qubit between encodings (e.g., a suitable microwave pulse can be applied to a two-junction transmon qubit to switch the two-junction transmon qubit from the A-mode to the B-mode and/or from the B-mode to the A-mode). In various aspects and as explained in more detail below, mode-selective coupling can be implemented between adjacent and/or neighboring two-junction transmon qubits in order to facilitate selective cross-resonance entanglement. In some cases, mode-selective coupling can be implemented between next-nearest-neighbor two-junction transmon qubits in order to facilitate selective cross-resonance entanglement.

As mentioned above, a quantum computing lattice that includes bus-resonators between single-junction transmon qubits can require five distinctly fabricated sets of qubits (e.g., one set corresponding to the control qubit and four distinct sets corresponding to the four distinct target qubits, which can have distinct transition frequencies for a total of five transition frequencies). On the other hand, in various instances and as explained further throughout this disclosure, a quantum computing lattice that includes mode-selective couplers between two-junction transmon qubits can require three distinctly fabricated sets of qubits rather than five (e.g., a first set of two-junction transmon qubits with a first A-mode transition frequency and a first B-mode transition frequency, a second set of two-junction transmon qubits with a second A-mode transition frequency and a second B-mode transition frequency, and a third set of two-junction transmon qubits with a third A-mode transition frequency and a third B-mode transition frequency, for a total of six distinct transition frequencies).

In various cases, this reduction in the number of sets of qubits that are required to be fabricated in a quantum computing lattice can reduce the probability and/or prevalence of target-based frequency collisions. After all, in various aspects, nanofabrication and/or microfabrication can include inherent and/or unintentional process variations that make it difficult to perfectly control structural characteristics, and thus transition frequencies, of superconducting qubits. When a greater number of distinct sets of superconducting qubits are fabricated, there can be fewer and/or smaller differences between the structural characteristics of one of the distinct sets of superconducting qubits and another of the distinct sets of superconducting qubits. In some cases, the inherent and/or unintentional process variations during nanofabrication and/or microfabrication can further reduce these already-few and/or already-small differences in structural characteristics, which can cause target-based frequency collisions (e.g., can cause the structural characteristics of one of the distinct sets of superconducting qubits to be too similar to the structural characteristics of another of the distinct sets of superconducting qubits). On the other hand, when a lesser number of distinct sets of superconducting qubits are fabricated, there can be more and/or greater differences between the structural characteristics of one of the distinct sets of superconducting qubits and the structural characteristics of another of the distinct sets of superconducting qubits. In various cases, these more and/or greater differences in structural characteristics can help to ensure that, even when affected by process variations, the structural characteristics of the distinct sets of superconducting qubits can be sufficiently different so as to reduce the likelihood of target-based frequency collisions.

In other words, creating five distinct sets of superconducting qubits from a fixed pool of possible qubit structural characteristics can cause those five distinct sets to have fewer and/or smaller structural differences, and those fewer and/or smaller structural differences can be more easily blurred by inherent and/or unintentional process variations during nanofabrication and/or microfabrication, thereby increasing the likelihood of target-based frequency collisions. On the other hand, creating three distinct sets of superconducting qubits from the fixed pool of possible qubit structural characteristics can cause those three distinct sets to have more and/or greater structural differences (e.g., at least as compared to the situation in which five distinct sets of qubits are fabricated), and those more and/or greater structural differences can be less easily blurred by inherent and/or unintentional process variations during nanofabrication and/or microfabrication, thereby decreasing the likelihood of target-based frequency collisions. Thus, by reducing the number of distinct sets of superconducting qubits that need to be fabricated, a statistical probability of target-based frequency collisions can be reduced.

Because various embodiments of the invention can facilitate the creation of a quantum computing lattice using three distinct sets of superconducting qubits rather than five distinct sets of superconducting qubits, various embodiments of the invention can reduce the probability and/or prevalence of target-based frequency collisions. Moreover, in various cases, such reduction in the probability and/or prevalence of target-based frequency collisions can be accomplished without a corresponding reduction in lattice connectivity. For at least these reasons, various embodiments of the invention constitute a concrete and tangible technical improvement in the field of superconducting qubit fabrication. Furthermore, in various instances, this reduction in the probability and/or prevalence of target-based frequency collisions can be accomplished without the use of magnetic fluxes (e.g., in various aspects, embodiments of the invention can provide for physical lattice architectures that are less vulnerable to target-based frequency collisions, that do not exhibit reduced connectivity, and that do not require the use of magnetic fluxes to facilitate selective cross-resonance entanglement).

In various embodiments, one or more of these technical benefits can be facilitated by creating a quantum computing lattice based on two-junction transmon qubits coupled with mode-selective couplers (e.g., architectures/structures that can facilitate mode-selective coupling between a pair of superconducting qubits). In various embodiments, a control qubit can be a two-junction transmon qubit. That is, in various cases, the control qubit can include a first Josephson junction and a second Josephson junction, where the first Josephson junction is serially coupled between an end capacitor pad and a middle capacitor pad, and where the second Josephson junction is serially coupled between the middle capacitor pad and another end capacitor pad. So, in various instances, the control qubit can have two distinct transition frequencies: a first A-mode transition frequency and a first B-mode transition frequency. In various aspects, the control qubit can be coupled to a target qubit. In various instances, the target qubit can also be a two-junction transmon qubit (e.g., having two Josephson junctions, two end capacitor pads, and a middle capacitor pad). So, in various instances, the target qubit can have two distinct transition frequencies: a second A-mode transition frequency and a second B-mode transition frequency.

In various cases, the control qubit can be coupled to the target qubit by a first mode-selective coupler. In various embodiments, the first mode-selective coupler can facilitate A-mode coupling between the control qubit and the target qubit (e.g., when coupled via the first mode-selective coupler, the A-mode of the control qubit can couple to and/or entangle with the A-mode of the target qubit, but the B-mode of the control qubit cannot couple to and/or entangle with the B-mode of the target qubit). In various instances, in order to facilitate this A-mode coupling, the first mode-selective coupler can comprise a capacitor that capacitively couples the middle capacitor pad of the control qubit to the middle capacitor pad of the target qubit. In various embodiments, the capacitor of the first mode-selective coupler can be any suitable micro-structure and/or nano-structure that exhibits a net capacitance between the middle capacitor pad of the control qubit and the middle capacitor pad of the target qubit, such as a coplanar waveguide and/or a continuous piece of metal in suitable proximity to the middle capacitor pad of the control qubit and the middle capacitor pad of the target qubit. In various cases, a capacitance of the capacitor can be less than shunting capacitance values associated with the control qubit and less than shunting capacitance values associated with the target qubit. In various aspects, those having ordinary skill in the art will understand how to fabricate and/or implement such a capacitor between the middle capacitor pad of the control qubit and the middle capacitor pad of the target qubit. In various embodiments, such a capacitor between the middle capacitor pad of the control qubit and the middle capacitor pad of the target qubit can facilitate A-mode coupling between the control qubit and the target qubit and/or can prevent B-mode coupling between the control qubit and the target qubit.

In various other cases, rather than the first mode-selective coupler, the control qubit can be coupled to the target qubit by a second mode-selective coupler. In various embodiments, the second mode-selective coupler can facilitate B-mode coupling between the control qubit and the target qubit (e.g., when coupled via the second mode-selective coupler, the B-mode of the control qubit can couple to and/or entangle with the B-mode of the target qubit, but the A-mode of the control qubit cannot couple to and/or entangle with the A-mode of the target qubit). In various instances, in order to facilitate this B-mode coupling, the second mode-selective coupler can comprise a first capacitor and a second capacitor. In various cases, the first capacitor can capacitively couple an end capacitor pad of the control qubit to an end capacitor pad of the target qubit. In various cases, the second capacitor can capacitively couple the end capacitor pad of the control qubit to the middle capacitor pad of the target qubit. In various embodiments, the first capacitor of the second mode-selective coupler can be any suitable micro-structure and/or nano-structure that exhibits a net capacitance between the end capacitor pad of the control qubit and the end capacitor pad of the target qubit, such as a coplanar waveguide and/or a continuous piece of metal in suitable proximity to the end capacitor pad of the control qubit and the end capacitor pad of the target qubit. Similarly, in various embodiments, the second capacitor of the second mode-selective coupler can be any suitable micro-structure and/or nano-structure that exhibits a net capacitance between the end capacitor pad of the control qubit and the middle capacitor pad of the target qubit, such as a coplanar waveguide and/or a continuous piece of metal in suitable proximity to the end capacitor pad of the control qubit and the middle capacitor pad of the target qubit. In various cases, a first capacitance of the first capacitor can be less than shunting capacitance values associated with the control qubit and less than shunting capacitance values associated with the target qubit. In various cases, a second capacitance of the second capacitor can be half the first capacitance. In various aspects, those having ordinary skill in the art will understand how to fabricate and/or implement the first capacitor between the end capacitor pad of the control qubit and the end capacitor pad of the target qubit, and will also understand how to fabricate and/or implement the second capacitor between the end capacitor pad of the control qubit and the middle capacitor pad of the target qubit. In various embodiments, such a first capacitor between the end capacitor pad of the control qubit and the end capacitor pad of the target qubit and such a second capacitor between the end capacitor pad of the control qubit and the middle capacitor pad of the target qubit can facilitate B-mode coupling between the control qubit and the target qubit and/or can prevent A-mode coupling between the control qubit and the target qubit.

In various other embodiments, a control qubit can be coupled to a first target qubit and to a second target qubit, all of which can be two-junction transmon qubits (e.g., the control qubit can have two Josephson junctions, two end capacitor pads, and a middle capacitor pad; the first target qubit can have two Josephson junctions, two end capacitor pads, and a middle capacitor pad; the second target qubit can have two Josephson junctions, two end capacitor pads, and a middle capacitor pad). Thus, the first target qubit can exhibit two distinct transition frequencies (e.g., an A-mode transition frequency (denoted $f_{A1}$, where $f_{A1}$ can be any suitable frequency value) and a B-mode transition frequency (denoted fill, where fill is not equal tofu). Similarly, the second target qubit can exhibit two distinct transition frequencies (e.g., an A-mode transition frequency (denoted $f_{A2}$, where $f_{A2}$ can be any suitable frequency value) and a B-mode transition frequency (denoted $f_{B2}$, where $f_{B2}$ is not equal to $f_{A2}$). In various cases, the control qubit can be coupled to the first target qubit by the first mode-selective coupler, as described above (e.g., a capacitor that couples the middle capacitor pad of the control qubit to the middle capacitor pad of the first target qubit), thereby facilitating A-mode coupling between the control qubit and the first target qubit and thereby preventing B-mode coupling between the control qubit and the first target qubit. In various cases, the control qubit can be coupled to the second target qubit by the second mode-selective coupler, as described above (e.g., a first capacitor that couples an end capacitor pad of the control qubit to an end capacitor pad of the second target qubit, and a second capacitor that couples that same end capacitor pad of the control qubit to the middle capacitor pad of the second target qubit), thereby facilitating B-mode coupling between the control qubit and the second target qubit and thereby preventing A-mode coupling between the control qubit and the second target qubit.

In various instances, the first target qubit and the second target qubit can be non-degenerate targets. That is, in some cases, the first target qubit and the second target qubit can have dissimilar structural characteristics such that $f_{A1}$ is not equal to $f_{A2}$ and such that fill is not equal to $f_{B2}$. In such case, selective cross-resonance entanglement between the control qubit and either the first target qubit and/or the second target qubit can be facilitated. Specifically, in some instances, the control qubit can be driven by a microwave pulse and/or tone that has a frequency of $f_{A1}$. In such case, the control qubit can become entangled with the first target qubit (e.g., the microwave pulse and/or tone has a frequency that matches the A-mode transition frequency of the first target qubit, and the first mode-selective coupler can facilitate A-mode coupling between the control qubit and the first target qubit, thereby resulting in entanglement). Moreover, in such case, the control qubit can avoid becoming entangled with the second target qubit (e.g., since the targets are non-degenerate, the microwave pulse and/or tone having a frequency of $f_{A1}$ does not match either the A-mode transition frequency ($f_{A2}$) or the B-mode transition frequency ($f_{AB2}$) of the second target qubit, thereby preventing entanglement). In some instances, the control qubit can be driven by a microwave pulse and/or tone that has a frequency of $f_{B2}$. In such case, the control qubit can become entangled with the second target qubit (e.g., the microwave pulse and/or tone has a frequency that matches the B-mode transition frequency of the second target qubit, and the second mode-selective coupler can facilitate B-mode coupling between the control qubit and the second target qubit, thereby resulting in entanglement). Moreover, in such case, the control qubit can avoid becoming entangled with the first target qubit (e.g., since the targets are non-degenerate, the microwave pulse and/or tone having a frequency of $f_{B2}$ does not match either the A-mode transition frequency ($f_{A1}$) or the B-mode transition frequency ($f_{B1}$) of the first target qubit). In various aspects, note that a microwave pulse and/or tone having a frequency of $f_{B1}$ can, in some cases, not cause the control qubit to entangle with either the first target qubit or the second target qubit (e.g., the frequency of the microwave pulse and/or tone does not match either the A-mode transition frequency or the B-mode transition frequency of the second target qubit; although the frequency of the microwave pulse and/or tone matches the B-mode transition frequency of the first target qubit, the first mode-selective coupler can prevent B-mode coupling between the control qubit and the first target qubit). Similarly, in various aspects, note that a microwave pulse and/or tone having a frequency of $f_{A2}$ can, in some cases, not cause the control qubit to entangle with either the first target qubit or the second target qubit (e.g., the frequency of the microwave pulse and/or tone does not match either the A-mode transition frequency or the B-mode transition frequency of the first target qubit; although the frequency of the microwave pulse and/or tone matches the A-mode transition frequency of the second target qubit, the second mode-selective coupler can prevent A-mode coupling between the control qubit and the second target qubit).

In various instances, the first target qubit and the second target qubit can be degenerate targets. That is, in some cases, the first target qubit and the second target qubit can have similar and/or identical structural characteristics such that $f_{A1}$ is equal to and/or substantially equal to $f_{A2}$ and such that $f_{B1}$ is equal to and/or substantially equal to $f_{B2}$. Even in such a case, selective entanglement between the control qubit and either the first target qubit and/or the second target qubit can be facilitated. Specifically, in some instances, the control qubit can be driven by a microwave pulse and/or tone that has a frequency of $f_{A1}=f_{A2}$. In such case, the control qubit can become entangled with the first target qubit and not with the second target qubit. After all, the microwave pulse and/or tone has a frequency that matches the A-mode transition frequency of the first target qubit, and the first mode-selective coupler can facilitate A-mode coupling between the control qubit and the first target qubit. Although the microwave pulse and/or tone has a frequency that also matches the A-mode transition frequency of the second target qubit (e.g., because they are degenerate targets), the second mode-selective coupler can prevent A-mode coupling between the control qubit and the second target qubit. In some instances, the control qubit can be driven by a microwave pulse and/or tone that has a frequency off $f_{B1}=f_{B2}$. In such case, the control qubit can become entangled with the second target qubit and not with the first target qubit. After all, the microwave pulse and/or tone has a frequency that matches the B-mode transition frequency of the second target qubit, and the second mode-selective coupler can facilitate B-mode coupling between the control qubit and the second target qubit. Although the microwave pulse and/or tone has a frequency that also matches the B-mode transition frequency of the first target qubit (e.g., because they are degenerate targets), the first mode-selective coupler can prevent B-mode coupling between the control qubit and the first target qubit.

Therefore, even with degenerate targets, embodiments of the invention can facilitate selective cross-resonance entanglement. In stark contrast, degenerate targets in a quantum computing lattice that employs single-junction transmon qubits coupled with bus resonators would not be able to undergo selective cross-resonance entanglement.

In various embodiments, the control qubit can be further coupled to a third target qubit and a fourth target qubit. In various cases, the third target qubit and the fourth target qubit can be two-junction transmon qubits (e.g., the third target qubit can have two Josephson junctions, two end capacitor pads, and a middle capacitor pad; the fourth target qubit can have two Josephson junctions, two end capacitor pads, and a middle capacitor pad). In various aspects, the third target qubit and the fourth target qubit can be degenerate targets (e.g., can be similar and/or identical to each other), and can be non-degenerate with the first target qubit and the second target qubit. In various aspects, another instance of the first mode-selective coupler can couple the control qubit to the third target qubit, and another instance of the second mode-selective coupler can couple the control qubit to the fourth target qubit. So, in various instances, A-mode coupling can be facilitated between the control qubit and the third target qubit, and B-mode coupling can be facilitated between the control qubit and the fourth target qubit. In various embodiments, selective cross-resonance entanglement can be facilitated between the control qubit and either the third target qubit and/or the fourth target qubit, just as described above with respect to the first and second target qubits.

That is, in various aspects, the control qubit can be coupled to four target qubits (e.g., the first, second, third, and fourth target qubits), such that A-mode coupling can be facilitated between the control qubit and two of the target qubits (e.g., the first and third target qubits), and such that B-mode coupling can be facilitated between the control qubit and the other two of the target qubits (e.g., the second and fourth target qubits). With such a configuration, selective cross-resonance entanglement can be facilitated between the control qubit and any one of the four target qubits, notwithstanding the fact that the first and second target qubits are degenerate and notwithstanding the fact that the third and fourth target qubits are degenerate. Since there can be two pairs of degenerate targets in such a scenario, there can be three distinct sets of superconducting qubits in the quantum computing lattice (e.g., a set corresponding to the control qubit, a set corresponding to the first and second target qubits which are degenerate, and a set corresponding to the third and fourth target qubits which are degenerate), rather than five distinct sets of superconducting qubits. In various aspects, this reduction in the number of distinct sets of superconducting qubits required to form a quantum computing lattice can reduce the probability and/or prevalence of target-based frequency collisions, without correspondingly decreasing lattice connectivity. Thus, various embodiments of the invention constitute a concrete and tangible technical improvement in the field of superconducting qubit fabrication.

To help clarify the above discussion, consider the following non-limiting, illustrative example. Consider a control qubit and four target qubits W, X, Y, and Z. Suppose that the control qubit and the four target qubits W, X, Y, and Z are two-junction transmon qubits. Further, suppose that the target qubit W and the target qubit X are degenerate, and suppose that the target qubit Y and the target qubit Z are degenerate. In such case, only three types and/or sets of qubits are involved in the illustration: a first type and/or set corresponding to the control qubit, a second type and/or set corresponding to the target qubits W and X which are degenerate, and a third type and/or set corresponding to the target qubits Y and Z which are degenerate. Suppose that the control qubit is coupled to the target qubit W by a mode-selective coupler that facilitates A-mode coupling, and suppose that the control qubit is coupled to the target qubit X by a mode-selective coupler that facilitates B-mode coupling. Similarly, suppose that the control qubit is coupled to the target qubit Y by a mode-selective coupler that facilitates A-mode coupling, and suppose that the control qubit is coupled to the target qubit Z by a mode-selective coupler that facilitates B-mode coupling.

In various aspects, selective cross-resonance entanglement can be facilitated. In some cases, the control qubit can be driven by a microwave pulse and/or tone that has a frequency corresponding to the A-mode transition frequency of the target qubit W. Because the frequency of the microwave pulse and/or tone matches the A-mode transition frequency of the target qubit W and because A-mode coupling between the control qubit and the target qubit W is facilitated, the control qubit can entangle with the target qubit W. Note that the control qubit can avoid entangling with the target qubit X in such case. After all, even though the microwave pulse and/or tone has a frequency that matches the A-mode transition frequency of the target qubit X (e.g., W and X are degenerate targets), A-mode coupling is not facilitated between the control qubit and the target qubit X; instead, only B-mode coupling is facilitated between the control qubit and the target qubit X. Furthermore, note that the control qubit can avoid entangling with the target qubits Y and Z in such case since neither their A-mode transition frequency nor their B-mode transition frequency matches the frequency of the microwave pulse and/or tone (e.g., Y and Z can be non-degenerate with W and X).

In various cases, the control qubit can be driven by a microwave pulse and/or tone that has a frequency corresponding to the B-mode transition frequency of the target qubit X. Because the frequency of the microwave pulse and/or tone matches the B-mode transition frequency of the target qubit X and because B-mode coupling between the control qubit and the target qubit X is facilitated, the control qubit can entangle with the target qubit X. Note that the control qubit can avoid entangling with the target qubit W in such case. After all, even though the microwave pulse and/or tone has a frequency that matches the B-mode transition frequency of the target qubit W (e.g., W and X are degenerate targets), B-mode coupling is not facilitated between the control qubit and the target qubit W; instead, only A-mode coupling is facilitated between the control qubit and the target qubit W. Furthermore, note that the control qubit can avoid entangling with the target qubits Y and Z in such case since neither their A-mode transition frequency nor their B-mode transition frequency matches the frequency of the microwave pulse and/or tone (e.g., Y and Z can be non-degenerate with W and X).

In various cases, the control qubit can be driven by a microwave pulse and/or tone that has a frequency corresponding to the A-mode transition frequency of the target qubit Y. Because the frequency of the microwave pulse and/or tone matches the A-mode transition frequency of the target qubit Y and because A-mode coupling between the control qubit and the target qubit Y is facilitated, the control qubit can entangle with the target qubit Y. Note that the control qubit can avoid entangling with the target qubit Z in such case. After all, even though the microwave pulse and/or tone has a frequency that matches the A-mode transition frequency of the target qubit Z (e.g., Y and Z are degenerate targets), A-mode coupling is not facilitated between the control qubit and the target qubit Z; instead, only B-mode coupling is facilitated between the control qubit and the target qubit Z. Furthermore, note that the control qubit can avoid entangling with the target qubits W and X in such case since neither their A-mode transition frequency nor their B-mode transition frequency matches the frequency of the microwave pulse and/or tone (e.g., W and X can be non-degenerate with Y and Z).

In various cases, the control qubit can be driven by a microwave pulse and/or tone that has a frequency corresponding to the B-mode transition frequency of the target qubit Z. Because the frequency of the microwave pulse and/or tone matches the B-mode transition frequency of the target qubit Z and because B-mode coupling between the control qubit and the target qubit Z is facilitated, the control qubit can entangle with the target qubit Z. Note that the control qubit can avoid entangling with the target qubit Y in such case. After all, even though the microwave pulse and/or tone has a frequency that matches the B-mode transition frequency of the target qubit Y (e.g., Y and Z are degenerate targets), B-mode coupling is not facilitated between the control qubit and the target qubit Y; instead, only A-mode coupling is facilitated between the control qubit and the target qubit Y. Furthermore, note that the control qubit can avoid entangling with the target qubits W and X since neither their A-mode transition frequency nor their B-mode transition frequency matches the frequency of the microwave pulse and/or tone (e.g., W and X can be non-degenerate with Y and Z).

As shown by this non-limiting, illustrative example, various embodiments of the invention can facilitate selective cross-resonance entanglement with as few as three distinct sets of superconducting qubits, rather than requiring as many as five distinct sets of superconducting qubits. This reduction in the number of distinct sets of superconducting qubits needed to facilitate selective cross-resonance entanglement can, in various cases, reduce a statistical likelihood of target-based frequency collisions without correspondingly reducing lattice connectivity.

Various embodiments of the invention include novel systems, architectures, and/or techniques for facilitating mode-selective coupling for frequency collision reduction that are not abstract, that are not natural phenomena, that are not laws of nature, and that cannot be performed as a set of mental acts by a human. Instead, various embodiments of the invention include systems, architectures, and/or techniques for facilitating frequency collision reduction without requiring a corresponding reduction in lattice connectivity. Frequency collisions can negatively affect the performance of a quantum computing lattice. Although some techniques can reduce the probability of frequency collisions by reducing lattice connectivity (e.g., by reducing a number of connections in the quantum computing lattice), such low-degree lattices are more vulnerable to errors. Various embodiments of the invention can reduce the statistical likelihood of frequency collisions without decreasing lattice connectivity. Specifically, a control qubit can be coupled to a first target qubit by a first mode-selective coupler that can facilitate A-mode coupling between the control qubit and the first target qubit (e.g., suitable structures of such a first mode-selective coupler are disclosed herein). Similarly, the control qubit can be coupled to a second target qubit by a second mode-selective coupler that can facilitate B-mode coupling between the control qubit and the second target qubit (e.g., suitable structures of such a second mode-selective couple are disclosed herein). In various aspects, the first and second mode-selective couplers can allow selective cross-resonance entanglement to occur, even when the first and second target qubits are degenerate. In a nearest-neighbor-connected quantum computing lattice (e.g., where each non-perimetral qubit is coupled to all four of its adjacent neighbors) made up of two-junction transmon qubits, such first and second mode-selective couplers can allow selective cross-resonance entanglement to occur with as few as three distinct sets of superconducting qubits. That is, various embodiments of the invention can reduce a number of distinct sets of qubits required to implement selective cross-resonance entanglement in a nearest-neighbor-connected quantum computing lattice. This reduction in the number of distinct sets of qubits can correspondingly reduce the chances of frequency collisions occurring within the quantum computing lattice. Thus, various embodiments of the invention can improve the performance of a quantum computing system (e.g., reduced probability of target-based frequency collisions), and so various embodiments of the invention constitute a concrete and tangible technical improvement in the field of superconducting qubit fabrication.

In various aspects, it should be appreciated that the figures of this disclosure are exemplary and non-limiting only and are not necessarily drawn to scale.

FIG. 1 illustrates a circuit diagram of an example, non-limiting system 100 that can facilitate A-mode coupling in accordance with one or more embodiments described herein. As shown, the system 100 can comprise a two-junction transmon qubit 102 and a two-junction transmon qubit 104.

In various embodiments, the two-junction transmon qubit 102 can comprise a Josephson junction 106 that is shunted by a capacitor 110. In various cases, the two-junction transmon qubit 102 can also comprise a Josephson junction 108 that is shunted by a capacitor 112. In various instances, the two-junction transmon qubit 102 can further comprise a capacitor 114 that shunts both the Josephson junction 106 and the Josephson junction 108. In various aspects, the two-junction transmon qubit 102 can be considered as comprising two single-junction transmon qubits that are coupled in series such that they share a capacitor pad. Specifically, the Josephson junction 106 shunted by the capacitor 110 can be considered as a first single-junction transmon qubit formed from a first capacitor pad and a second capacitor pad (not shown in FIG. 1). In various aspects, the first capacitor pad and the second capacitor pad can shunt the Josephson junction 106 to form the capacitor 110. Moreover, the Josephson junction 108 shunted by the capacitor 112 can be considered as a second single-junction transmon qubit formed from the second capacitor pad and a third capacitor pad (not shown in FIG. 1). In various aspects, the second capacitor pad and the third capacitor pad can shunt the Josephson junction 108 to form the capacitor 112. Moreover, the first capacitor pad and the third capacitor pad can shunt both the Josephson junction 106 and the Josephson junction 108 to form the capacitor 114. In various aspects, a physical structure of the two-junction transmon qubit 102 can be more clearly depicted in FIG. 2, discussed below.

In various instances, the two-junction transmon qubit 102 can support and/or exhibit two distinct excitation modes. In various aspects, these two distinct excitation modes can be referred to as an A-mode and a B-mode. In various aspects, the A-mode can be associated with an A-mode transition frequency of the two-junction transmon qubit 102. Similarly, the B-mode can be associated with a B-mode transition frequency of the two-junction transmon qubit 102. In various aspects, the A-mode transition frequency can be distinct and/or unequal to the B-mode transition frequency. As one having ordinary skill in the art will understand, the A-mode transition frequency and/or the B-mode transition frequency of the two-junction transmon qubit 102 can be set and/or controlled during fabrication, subject to inherent and/or unintentional process variations.

In some embodiments, the two-junction transmon qubit 102 can be encoded in either the A-mode and/or the B-mode. In various aspects, when the two-junction transmon qubit 102 is encoded in the A-mode, the two-junction transmon qubit can exhibit the A-mode transition frequency and can avoid exhibiting the B-mode transition frequency. In various aspects, when the two-junction transmon qubit 102 is encoded in the B-mode, the two-junction transmon qubit 102 can exhibit the B-mode transition frequency and can avoid exhibiting the A-mode transition frequency.

In various aspects, the two-junction transmon qubit 102 can be encoded into the A-mode and/or the B-mode (e.g., the two-junction transmon qubit 102 can be switched from the A-mode to the B-mode and/or from the B-mode to the A-mode) by short microwave pulses, as understood by those of ordinary skill in the art.

In various embodiments, the two-junction transmon qubit 104 can be similar to the two-junction transmon qubit 102. That is, in various aspects, the two-junction transmon qubit 104 can comprise a Josephson junction 116 that is shunted by a capacitor 120. In various cases, the two-junction transmon qubit 104 can also comprise a Josephson junction 118 that is shunted by a capacitor 122. In various instances, the two-junction transmon qubit 104 can further comprise a capacitor 124 that shunts both the Josephson junction 116 and the Josephson junction 118. In various aspects, the two-junction transmon qubit 104 can be considered as comprising two single-junction transmon qubits that are coupled in series such that they share a capacitor pad. Specifically, the Josephson junction 116 shunted by the capacitor 120 can be considered as a first single-junction transmon qubit formed from a first capacitor pad and a second capacitor pad (separate from the first and second capacitor pads of the two-junction transmon qubit 102, and not shown in FIG. 1). In various aspects, the first capacitor pad and the second capacitor pad can shunt the Josephson junction 116 to form the capacitor 120. Moreover, the Josephson junction 118 shunted by the capacitor 122 can be considered as a second single-junction transmon qubit formed from the second capacitor pad and a third capacitor pad (separate from the second and third capacitor pads of the two-junction transmon qubit 102, and not shown in FIG. 1). In various aspects, the second capacitor pad and the third capacitor pad can shunt the Josephson junction 118 to form the capacitor 122. Moreover, the first capacitor pad and the third capacitor pad can shunt both the Josephson junction 116 and the Josephson junction 118 to form the capacitor 124. In various aspects, a physical structure of the two-junction transmon qubit 104 can be more clearly depicted in FIG. 2, discussed below.

In various instances, the two-junction transmon qubit 104 can support and/or exhibit two distinct excitation modes. In various aspects, these two distinct excitation modes can be referred to as an A-mode and a B-mode. In various aspects, the A-mode can be associated with an A-mode transition frequency of the two-junction transmon qubit 104. Similarly, the B-mode can be associated with a B-mode transition frequency of the two-junction transmon qubit 104. In various aspects, the A-mode transition frequency can be distinct and/or unequal to the B-mode transition frequency. In various aspects, the A-mode transition frequency and the B-mode transition frequency of the two-junction transmon qubit 104 can be respectively different and/or unequal to the A-mode transition frequency and the B-mode transition frequency of the two-junction transmon qubit 102.

In some embodiments, just as with the two-junction transmon qubit 102, the two-junction transmon qubit 104 can be encoded in either the A-mode and/or the B-mode. In various cases, short microwave pulses can be used to switch between the A-mode encoding and the B-mode encoding, as understood by those of ordinary skill in the art. As one having ordinary skill in the art will understand, the A-mode transition frequency and/or the B-mode transition frequency of the two-junction transmon qubit 104 can be set and/or controlled during fabrication, subject to inherent and/or unintentional process variations.

In various embodiments, the two-junction transmon qubit 102 can be coupled to the two-junction transmon qubit 104 by a first mode-selective coupler 126. In various aspects, the first mode-selective coupler 126 can facilitate A-mode coupling between the two-junction transmon qubit 102 and the two-junction transmon qubit 104. In other words, the first mode-selective coupler 126 can function such that the A-mode excitation of the two-junction transmon qubit 102 can couple to and/or entangle with the A-mode excitation of the two-junction transmon qubit 104, and such that the B-mode excitation of the two-junction transmon qubit 102 cannot couple to and/or entangle with the B-mode excitation of the two-junction transmon qubit 104. In various aspects, as shown, the first mode-selective coupler 126 can comprise a capacitor 128. In various aspects, the capacitor 128 can capacitively couple a middle capacitor pad (e.g., the second capacitor pad) of the two-junction transmon qubit 102 to a middle capacitor pad (e.g., the second capacitor pad) of the two-junction transmon qubit 104. In various aspects, the capacitance of the capacitor 128 can be less than shunting capacitance values of the two-junction transmon qubit 102 (e.g., less than the capacitance of the capacitor 110, less than the capacitance of the capacitor 112, and less than the capacitance of the capacitor 114) and less than shunting capacitance values of the two-junction transmon qubit 104 (e.g., less than the capacitance of the capacitor 120, less than the capacitance of the capacitor 122, and less than the capacitance of the capacitor 124). In various aspects, such a capacitive coupling structure can facilitate A-mode coupling between the two-junction transmon qubit 102 and the two-junction transmon qubit 104 while preventing B-mode coupling between the two-junction transmon qubit 102 and the two-junction transmon qubit 104. In various instances, the structure of the first mode-selective coupler 126 can be more clearly depicted in FIG. 2, discussed below.

In various aspects, the two-junction transmon qubit 102 can function as a control qubit, and the two-junction transmon qubit 104 can function as a target qubit. In various aspects, a cross-resonance direction can be said to run along the first mode-selective coupler 126 from the two-junction transmon qubit 102 to the two-junction transmon qubit 104.

Figure 2:
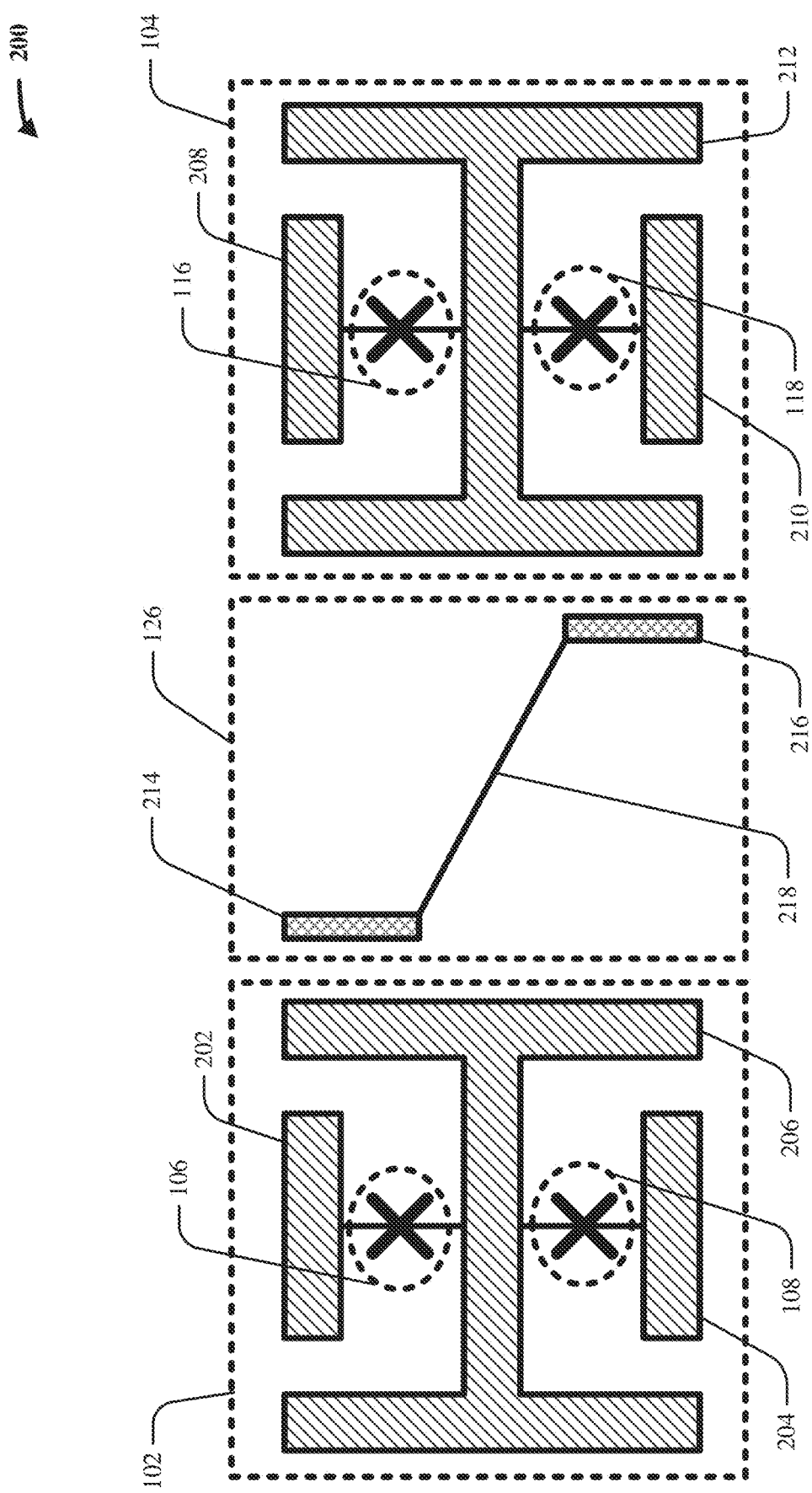
FIG. 2 illustrates a block diagram of an example, non-limiting system that facilitates A-mode coupling in accordance with one or more embodiments described herein.

FIG. 2 illustrates a block diagram of an example, non-limiting system 200 that can facilitate A-mode coupling in accordance with one or more embodiments described herein. In various aspects, FIG. 2 can illustrate a physical structure/architecture that can implement the circuit depicted in FIG. 1.

In various aspects, the system 200 can comprise the two-junction transmon qubit 102 and the two-junction transmon qubit 104, which can be coupled together by the first mode-selective coupler 126. As explained above, FIG. 1 depicts a circuit diagram of the two-junction transmon qubit 102, the two-junction transmon qubit 104, and the first mode-selective coupler 126. FIG. 2, on the other hand, depicts physical structures and/or architectures that can be used to implement the two-junction transmon qubit 102, the two-junction transmon qubit 104, and the first mode-selective coupler 126.

In various embodiments, the two-junction transmon qubit 102 can comprise the Josephson junction 106, the Josephson junction 108, an end capacitor pad 202, an end capacitor pad 204, and a middle capacitor pad 206. As shown, in various aspects, the end capacitor pad 202 can be coupled to the Josephson junction 106. Similarly, as shown, the middle capacitor pad 206 can be coupled to the Josephson junction 106, such that the end capacitor pad 202, the Josephson junction 106, and the middle capacitor pad 206 can be in series with each other. In various aspects, the end capacitor pad 202 and the middle capacitor pad 206 can be considered as shunting the Josephson junction 106. In other words, the end capacitor pad 202 and the middle capacitor pad 206 can, in various aspects, collectively form and/or function as the capacitor 110.

As shown, in various aspects, the Josephson junction 108 can be coupled to the middle capacitor pad 206. Similarly, as shown, the end capacitor pad 204 can be coupled to the Josephson junction 108, such that the middle capacitor pad 206, the Josephson junction 108, and the end capacitor pad 204 can be in series with each other. In various aspects, the middle capacitor pad 206 and the end capacitor pad 204 can be considered as shunting the Josephson junction 108. In other words, the middle capacitor pad 206 and the end capacitor pad 204 can, in various aspects, collectively form and/or function as the capacitor 112.

As shown, in various aspects, the end capacitor pad 202, the Josephson junction 106, the middle capacitor pad 206, the Josephson junction 108, and the end capacitor pad 204 can be coupled together such that they are all in series with each other. In various instances, the end capacitor pad 202 and the end capacitor pad 204 can be considered as shunting both the Josephson junction 106 and the Josephson junction 108. In other words, the end capacitor pad 202 and the end capacitor pad 204 can, in various aspects, collectively form and/or function as the capacitor 114.

In various aspects, as mentioned above, the two-junction transmon qubit 102 can be considered as two serially-coupled single-junction transmon qubits that share a middle capacitor pad. Specifically, the end capacitor pad 202, the Josephson junction 106, and the middle capacitor pad 206 can be considered as a first single-junction transmon qubit. Similarly, the middle capacitor pad 206, the Josephson junction 108, and the end capacitor pad 204 can be considered as a second single-junction transmon qubit that is in series with the first single-junction transmon qubit. As shown, the first single-junction transmon qubit and the second single-junction transmon qubit can share the middle capacitor pad 206.

In various embodiments, the end capacitor pad 202, the middle capacitor pad 206, and the end capacitor pad 204 can be composed of any suitable material for forming shunting capacitors in quantum computing systems (e.g., any suitable superconducting materials such as niobium). Although FIG. 2 depicts the end capacitor pad 202, the middle capacitor pad 206, and the end capacitor pad 204 as being composed of the same materials, this is non-limiting and for illustration only. In various aspects, the end capacitor pad 202, the middle capacitor pad 206, and the end capacitor pad 204 can comprise different materials. In various embodiments, the end capacitor pad 202, the middle capacitor pad 206, and the end capacitor pad 204 can have any suitable sizes, shapes, and/or dimensions. Although FIG. 2 depicts the end capacitor pad 202 and the end capacitor pad 204 as having similar sizes, shapes, and/or dimensions, this is non-limiting and for illustration only. In various aspects, the end capacitor pad 202 and the end capacitor pad 204 can have different sizes, shapes, and/or dimensions. In various aspects, the middle capacitor pad 206 can exhibit an H-shape, as shown. In various aspects, such an H-shape can provide additional surface area for coupling purposes. That is, such an H-shape can, in some cases, increase the lateral surface area of the middle capacitor pad 206 that is available for coupling (e.g., capacitive coupling, direct coupling, and/or otherwise) any other suitable quantum computing components and/or circuitry to the middle capacitor pad 206. In various embodiments, the middle capacitor pad 206 can have any other suitable size, shape, and/or dimensions.

As mentioned above, in various embodiments, the two-junction transmon qubit 102 can exhibit two distinct excitation modes: an A-mode and a B-mode. In various aspects, a mode structure of the A-mode excitation can be as follows: a bright mode component in the end capacitor pad 202, a dark mode component in the middle capacitor pad 206, and a bright mode component in the end capacitor pad 204. In various aspects, a mode structure of the B-mode excitation can be as follows: a dark mode component in the end capacitor pad 202, a neutral and/or zero mode component in the middle capacitor pad 206, and a bright mode component in the end capacitor pad 204.

In various embodiments, the two-junction transmon qubit 104 can exhibit an analogous structure and/or architecture as the two-junction transmon qubit 102. In various aspects, the two-junction transmon qubit 104 can comprise the Josephson junction 116, the Josephson junction 118, an end capacitor pad 208, an end capacitor pad 210, and a middle capacitor pad 212. As shown, in various aspects, the end capacitor pad 208 can be coupled to the Josephson junction 116. Similarly, as shown, the middle capacitor pad 212 can be coupled to the Josephson junction 116, such that the end capacitor pad 208, the Josephson junction 116, and the middle capacitor pad 212 can be in series with each other. In various aspects, the end capacitor pad 208 and the middle capacitor pad 212 can be considered as shunting the Josephson junction 116. In other words, the end capacitor pad 208 and the middle capacitor pad 212 can, in various aspects, collectively form and/or function as the capacitor 120.

As shown, in various aspects, the Josephson junction 118 can be coupled to the middle capacitor pad 212. Similarly, as shown, the end capacitor pad 210 can be coupled to the Josephson junction 118, such that the middle capacitor pad 212, the Josephson junction 118, and the end capacitor pad 210 can be in series with each other. In various aspects, the middle capacitor pad 212 and the end capacitor pad 210 can be considered as shunting the Josephson junction 118. In other words, the middle capacitor pad 212 and the end capacitor pad 210 can, in various aspects, collectively form and/or function as the capacitor 122.

As shown, in various aspects, the end capacitor pad 208, the Josephson junction 116, the middle capacitor pad 212, the Josephson junction 118, and the end capacitor pad 210 can be coupled together such that they are all in series with each other. In various instances, the end capacitor pad 208 and the end capacitor pad 210 can be considered as shunting both the Josephson junction 116 and the Josephson junction 118. In other words, the end capacitor pad 208 and the end capacitor pad 210 can, in various aspects, collectively form and/or function as the capacitor 124.

In various aspects, as mentioned above, the two-junction transmon qubit 104 can be considered as two serially-coupled single-junction transmon qubits that share a middle capacitor pad. Specifically, the end capacitor pad 208, the Josephson junction 116, and the middle capacitor pad 212 can be considered as a first single-junction transmon qubit. Similarly, the middle capacitor pad 212, the Josephson junction 118, and the end capacitor pad 210 can be considered as a second single-junction transmon qubit that is in series with the first single-junction transmon qubit. As shown, the first single-junction transmon qubit and the second single-junction transmon qubit can share the middle capacitor pad 212.

In various aspects, the sizes, shapes, dimensions, and/or materials of the end capacitor pad 208, the middle capacitor pad 212, and the end capacitor pad 210 can be as described above with respect to the end capacitor pad 202, the middle capacitor pad 206, and the end capacitor pad 204.

In various instances, a mode-structure of the A-mode excitation of the two-junction transmon qubit 104 can be as described above with respect to the mode structure of the A-mode excitation of the two-junction transmon qubit 102. Similarly, in various aspects, a mode-structure of the B-mode excitation of the two-junction transmon qubit 104 can be as described above with respect to the mode structure of the B-mode excitation of the two-junction transmon qubit 102.

In various embodiments, as shown, the first mode-selective coupler 126 can comprise a capacitor pad 214, a capacitor pad 216, and a transmission line 218. In various aspects, the capacitor pad 214 can be capacitively coupled to the middle capacitor pad 206, and the capacitor pad 216 can be capacitively coupled to the middle capacitor pad 212. In various aspects, the transmission line 218 can directly couple the capacitor pad 214 with the capacitor pad 216. In various instances, the capacitor pad 214, the capacitor pad 216, and the transmission line 218 can collectively exhibit a net capacitance. In other words, the capacitor pad 214, the capacitor pad 216, and the transmission line 218 can, in various cases, collectively form and/or function as the capacitor 128. As mentioned above, the capacitance of the capacitor 128 (e.g., the net capacitance of the capacitor pad 214, the capacitor pad 216, and the transmission line 218) can be less than shunting capacitance values of the two-junction transmon qubit 102 (e.g., less than the capacitance of the capacitor 110, less than the capacitance of the capacitor 112, and less than the capacitance of the capacitor 114) and can be less than shunting capacitance values of the two-junction transmon qubit 104 (e.g., less than the capacitance of the capacitor 120, less than the capacitance of the capacitor 122, and less than the capacitance of the capacitor 124).

In various embodiments, the capacitor pad 214 and the capacitor pad 216 can be composed of any suitable material for forming capacitors and/or capacitive connections in quantum computing systems (e.g., any suitable superconducting materials such as niobium). Although FIG. 2 depicts the capacitor pad 214 and the capacitor pad 216 as being composed of the same materials, this is non-limiting and for illustration only. In various aspects, the capacitor pad 214 and the capacitor pad 216 can comprise different materials. In various embodiments, the capacitor pad 214 and the capacitor pad 216 can have any suitable sizes, shapes, and/or dimensions. Although FIG. 2 depicts the capacitor pad 214 and the capacitor pad 216 as having similar sizes, shapes, and/or dimensions, this is non-limiting and for illustration only. In various aspects, the capacitor pad 214 and the capacitor pad 216 can have different sizes, shapes, and/or dimensions. In various aspects, the transmission line 218 can be composed of any suitable conductive material used in quantum computing systems (e.g., any suitable superconducting materials such as niobium). Although FIG. 2 depicts the transmission line 218 as being straight, this is non-limiting and for illustration only. In various aspects, the transmission line 218 can have any suitable size, shape, and/or dimensions.

In various aspects, the first mode-selective coupler 126 can have a different structure and/or architecture than that depicted in FIG. 2 (e.g., can have different components than the capacitor pad 214, the capacitor pad 216, and the transmission line 218). Specifically, in various embodiments, the first mode-selective coupler 126 can be any suitable structure, architecture, and/or quantum circuitry component that exhibits a net capacitance between the middle capacitor pad 206 and the middle capacitor pad 212, such as a coplanar waveguide. In other words, the first mode-selective coupler 126 can be any suitable structure that functions as a capacitor between the middle capacitor pad 206 and the middle capacitor pad 212, and/or that otherwise capacitively couples the middle capacitor pad 206 to the middle capacitor pad 212.

In various aspects, a net capacitive coupling as described above between the middle capacitor pad 206 and the middle capacitor pad 212 can facilitate A-mode coupling between the two-junction transmon qubit 102 and the two-junction transmon qubit 104. Moreover, in various aspects, a net capacitive coupling as described above between the middle capacitor pad 206 and the middle capacitor pad 212 can prevent B-mode coupling between the two-junction transmon qubit 102 and the two-junction transmon qubit 104.

Figure 3:
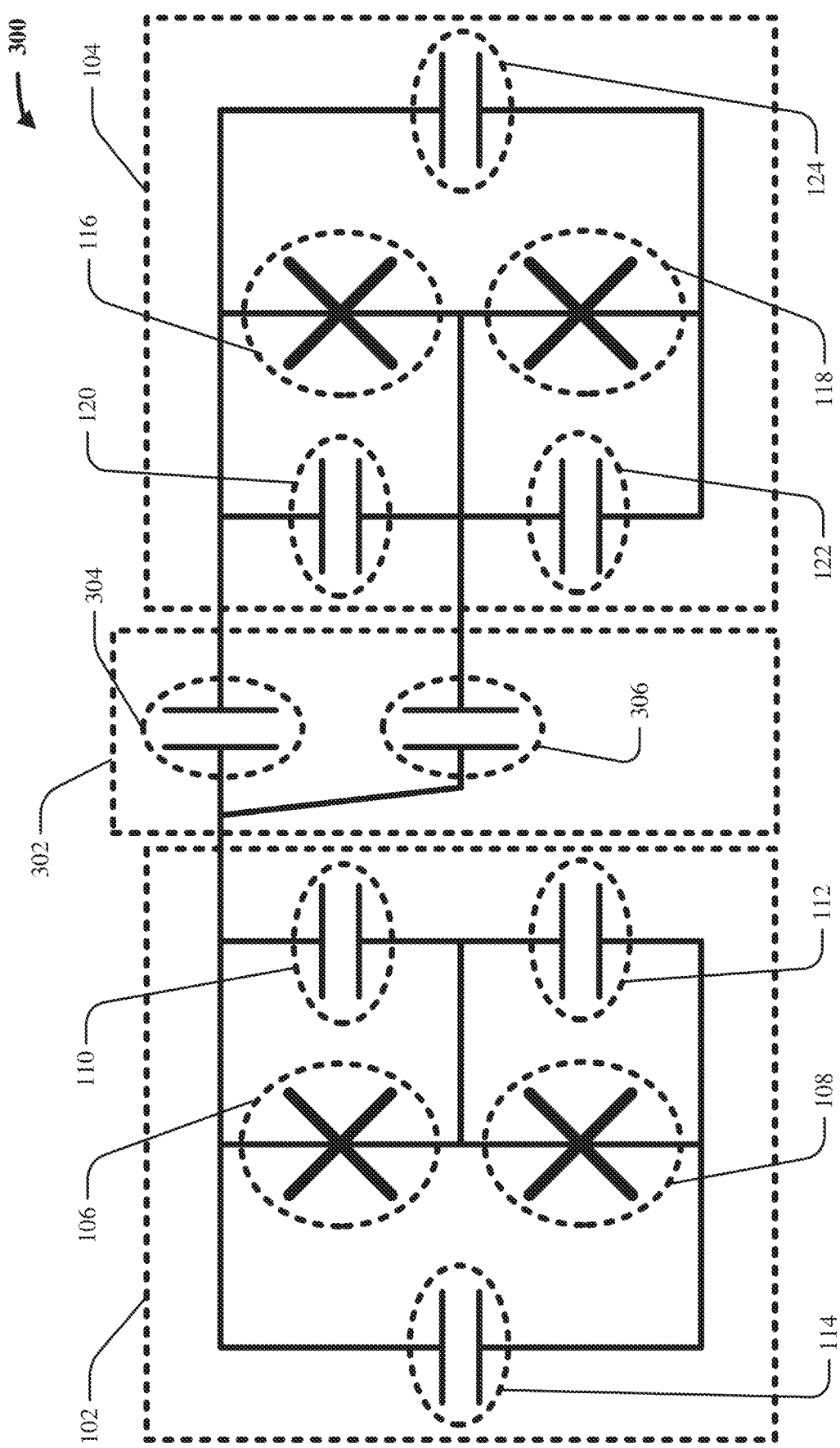
FIG. 3 illustrates a circuit diagram of an example, non-limiting system that facilitates B-mode coupling in accordance with one or more embodiments described herein.

FIG. 3 illustrates a circuit diagram of an example, non-limiting system 300 that can facilitate B-mode coupling in accordance with one or more embodiments described herein. As shown, the system 300 can comprise the two-junction transmon qubit 102 and the two-junction transmon qubit 104, as described above.

In various embodiments, the two-junction transmon qubit 102 can be coupled to the two-junction transmon qubit 104 by a second mode-selective coupler 302. In various aspects, the second mode-selective coupler 302 can facilitate B-mode coupling between the two-junction transmon qubit 102 and the two-junction transmon qubit 104. In other words, the second mode-selective coupler 302 can function such that the B-mode excitation of the two-junction transmon qubit 102 can couple to and/or entangle with the B-mode excitation of the two-junction transmon qubit 104, and such that the A-mode excitation of the two-junction transmon qubit 102 cannot couple to and/or entangle with the A-mode excitation of the two-junction transmon qubit 104. In various aspects, as shown, the second mode-selective coupler 302 can comprise a capacitor 304 and a capacitor 306. In various aspects, the capacitor 304 can capacitively couple an end capacitor pad (e.g., the first capacitor pad) of the two-junction transmon qubit 102 to an end capacitor pad (e.g., the first capacitor pad) of the two-junction transmon qubit 104. In various aspects, the capacitor 306 can capacitively couple the end capacitor pad (e.g., the first capacitor pad) of the two-junction transmon qubit 102 to a middle capacitor pad (e.g., the second capacitor pad) of the two-junction transmon qubit 104. In various aspects, the capacitance of the capacitor 304 can be less than shunting capacitance values of the two-junction transmon qubit 102 (e.g., less than the capacitance of the capacitor 110, less than the capacitance of the capacitor 112, and less than the capacitance of the capacitor 114) and less than shunting capacitance values of the two-junction transmon qubit 104 (e.g., less than the capacitance of the capacitor 120, less than the capacitance of the capacitor 122, and less than the capacitance of the capacitor 124). In various instances, the capacitance of the capacitor 306 can be half of the capacitance of the capacitor 304. In various aspects, such a capacitive coupling structure can facilitate B-mode coupling between the two-junction transmon qubit 102 and the two-junction transmon qubit 104 while preventing A-mode coupling between the two-junction transmon qubit 102 and the two-junction transmon qubit 104. In various instances, the structure of the second mode-selective coupler 302 can be more clearly depicted in FIG. 4, discussed below.

In various aspects, the two-junction transmon qubit 102 can function as a control qubit, and the two-junction transmon qubit 104 can function as a target qubit. In various aspects, a cross-resonance direction can be said to run along the second mode-selective coupler 302 from the two-junction transmon qubit 102 to the two-junction transmon qubit 104.

Figure 4:
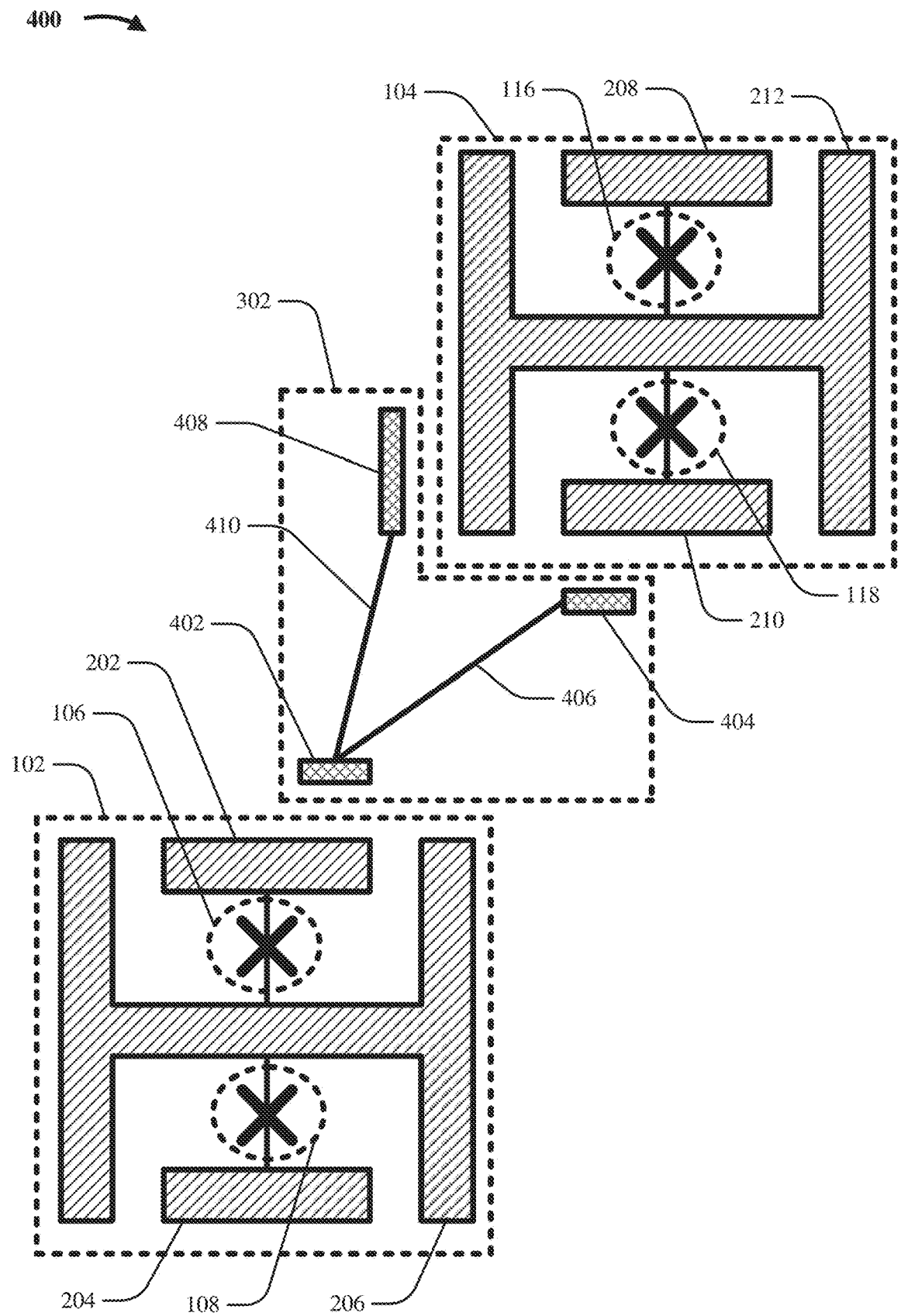
FIG. 4 illustrates a block diagram of an example, non-limiting system that facilitates B-mode coupling in accordance with one or more embodiments described herein.

FIG. 4 illustrates a block diagram of an example, non-limiting system 400 that can facilitate B-mode coupling in accordance with one or more embodiments described herein. In various aspects, FIG. 4 can illustrate a physical structure/architecture that can implement the circuit depicted in FIG. 3.

In various aspects, the system 400 can comprise the two-junction transmon qubit 102 and the two-junction transmon qubit 104, as described above, which can be coupled together by the second mode-selective coupler 302. As explained above, FIG. 3 depicts a circuit diagram of the two-junction transmon qubit 102, the two-junction transmon qubit 104, and the second mode-selective coupler 302. FIG. 4, on the other hand, depicts physical structures and/or architectures that can be used to implement the two-junction transmon qubit 102, the two-junction transmon qubit 104, and the second mode-selective coupler 302.

In various embodiments, as shown, the second mode-selective coupler 302 can comprise a capacitor pad 402, a capacitor pad 404, a capacitor pad 408, a transmission line 406, and a transmission line 410. In various aspects, the capacitor pad 402 can be capacitively coupled to the end capacitor pad 202, the capacitor pad 404 can be capacitively coupled to the end capacitor pad 210, and the capacitor pad 408 can be capacitively coupled to the middle capacitor pad 212. In various aspects, the transmission line 406 can directly couple the capacitor pad 402 with the capacitor pad 404. In various instances, the capacitor pad 402, the capacitor pad 404, and the transmission line 406 can exhibit a net capacitance. In other words, the capacitor pad 402, the capacitor pad 404, and the transmission line 406 can, in various cases, collectively form and/or function as the capacitor 304. As mentioned above, the capacitance of the capacitor 304 (e.g., the net capacitance of the capacitor pad 402, the capacitor pad 404, and the transmission line 406) can be less than shunting capacitance values of the two-junction transmon qubit 102 (e.g., less than the capacitance of the capacitor 110, less than the capacitance of the capacitor 112, and less than the capacitance of the capacitor 114) and can be less than shunting capacitance values of the two-junction transmon qubit 104 (e.g., less than the capacitance of the capacitor 120, less than the capacitance of the capacitor 122, and less than the capacitance of the capacitor 124).

In various aspects, the transmission line 410 can directly couple the capacitor pad 402 with the capacitor pad 408. In various instances, the capacitor pad 402, the capacitor pad 408, and the transmission line 410 can exhibit a net capacitance. In other words, the capacitor pad 402, the capacitor pad 408, and the transmission line 410 can, in various cases, collectively form and/or function as the capacitor 306. As mentioned above, the capacitance of the capacitor 306 (e.g., the net capacitance of the capacitor pad 402, the capacitor pad 408, and the transmission line 410) can be half of the capacitance of the capacitor 304 (e.g., half of the net capacitance of the capacitor pad 402, the capacitor pad 404, and the transmission line 406).

In various embodiments, the capacitor pad 402, the capacitor pad 404, and the capacitor pad 408 can be composed of any suitable material for forming capacitors and/or capacitive connections in quantum computing systems (e.g., any suitable superconducting materials such as niobium). Although FIG. 4 depicts the capacitor pad 402, the capacitor pad 404, and the capacitor pad 408 as being composed of the same materials, this is non-limiting and for illustration only. In various aspects, the capacitor pad 402, the capacitor pad 404, and the capacitor pad 408 can comprise different materials. In various embodiments, the capacitor pad 402, the capacitor pad 404, and the capacitor pad 408 can have any suitable sizes, shapes, and/or dimensions. Although FIG. 4 depicts the capacitor pad 402, the capacitor pad 404, and the capacitor pad 408 as having similar sizes, shapes, and/or dimensions, this is non-limiting and for illustration only. In various aspects, the capacitor pad 402, the capacitor pad 404, and the capacitor pad 408 can have different sizes, shapes, and/or dimensions. In various aspects, the transmission line 406 and the transmission line 410 can be composed of any suitable conductive materials used in quantum computing systems (e.g., any suitable superconducting materials such as niobium). In various aspects, the transmission line 406 and the transmission line 410 can comprise different materials. Although FIG. 4 depicts the transmission line 406 and the transmission line 410 as being straight, this is non-limiting and for illustration only. In various aspects, the transmission line 406 and the transmission line 410 can have any suitable size, shape, and/or dimensions. Although FIG. 4 depicts both the transmission line 406 and the transmission line 410 as being coupled to the capacitor pad 402, this is non-limiting and for illustration only. In various cases, the capacitor pad 402 can be coupled to the transmission line 406 and not coupled to the transmission line 410 (e.g., in such case, the second mode-selective coupler 302 can comprise a fourth capacitor pad, not shown, that is capacitively coupled to the end capacitor pad 202 and that is directly coupled to the transmission line 410). In various cases, the capacitor pad 402 can be coupled to the transmission line 410 and not coupled to the transmission line 406 (e.g., in such case, the second mode-selective coupler 302 can comprise a fourth capacitor pad, not shown, that is capacitively coupled to the end capacitor pad 202 and that is directly coupled to the transmission line 406).

In various embodiments, the second mode-selective coupler 302 can have a different structure and/or architecture than that depicted in FIG. 4 (e.g., can have different components than the capacitor pad 402, the capacitor pad 404, the capacitor pad 408, the transmission line 406, and the transmission line 410). Specifically, in various embodiments, the second mode-selective coupler 302 can be any suitable structure, architecture, and/or quantum circuitry component that exhibits a first net capacitance between the end capacitor pad 202 and the end capacitor pad 210, such as a coplanar waveguide, and exhibits a second net capacitance between the end capacitor pad 202 and the middle capacitor pad 212, such as a coplanar waveguide. In other words, the second mode-selective coupler 302 can be any suitable structure that functions as a first capacitor between the end capacitor pad 202 and the end capacitor pad 210 and that functions as a second capacitor between the end capacitor pad 202 and the middle capacitor pad 212. In yet other words, the second mode-selective coupler 302 can be any suitable structure that otherwise capacitively couples the end capacitor pad 202 to the end capacitor pad 210 and that otherwise capacitively couples the end capacitor pad 202 to the middle capacitor pad 212.

In various aspects, a first net capacitive coupling as described above between the end capacitor pad 202 and the end capacitor pad 210 and a second net capacitive coupling as described above between the end capacitor pad 202 and the middle capacitor pad 212 can facilitate B-mode coupling between the two-junction transmon qubit 102 and the two-junction transmon qubit 104. Moreover, in various aspects, a first net capacitive coupling as described above between the end capacitor pad 202 and the end capacitor pad 210 and a second net capacitive coupling as described above between the end capacitor pad 202 and the middle capacitor pad 212 can prevent A-mode coupling between the two-junction transmon qubit 102 and the two-junction transmon qubit 104.

Although FIG. 4 shows that the second mode-selective coupler 302 can capacitively couple the end capacitor pad 202 to the end capacitor pad 210, this is non-limiting and for illustration only. In various aspects, the second mode-selective coupler 302 can capacitively couple any end capacitor pad of the two-junction transmon qubit 102 (e.g., either the end capacitor pad 202 and/or the end capacitor pad 204) to any end capacitor pad of the two-junction transmon qubit 104 (e.g., either the end capacitor pad 208 and/or the end capacitor pad 210). Although FIG. 4 shows that the second mode-selective coupler 302 can capacitively couple the end capacitor pad 202 to the middle capacitor pad 212, this is non-limiting and for illustration only. In various aspects, the second mode-selective coupler 302 can capacitively couple any end capacitor pad of the two-junction transmon qubit 102 to the middle capacitor pad 212 of the two-junction transmon qubit 104, provided that that same end capacitor pad of the two-junction transmon qubit 102 is capacitively coupled to an end capacitor pad of the two-junction transmon qubit 104.

In various aspects, the two-junction transmon qubit 102 can function as a control qubit, and the two-junction transmon qubit 104 can function as a target qubit.

Figure 5:
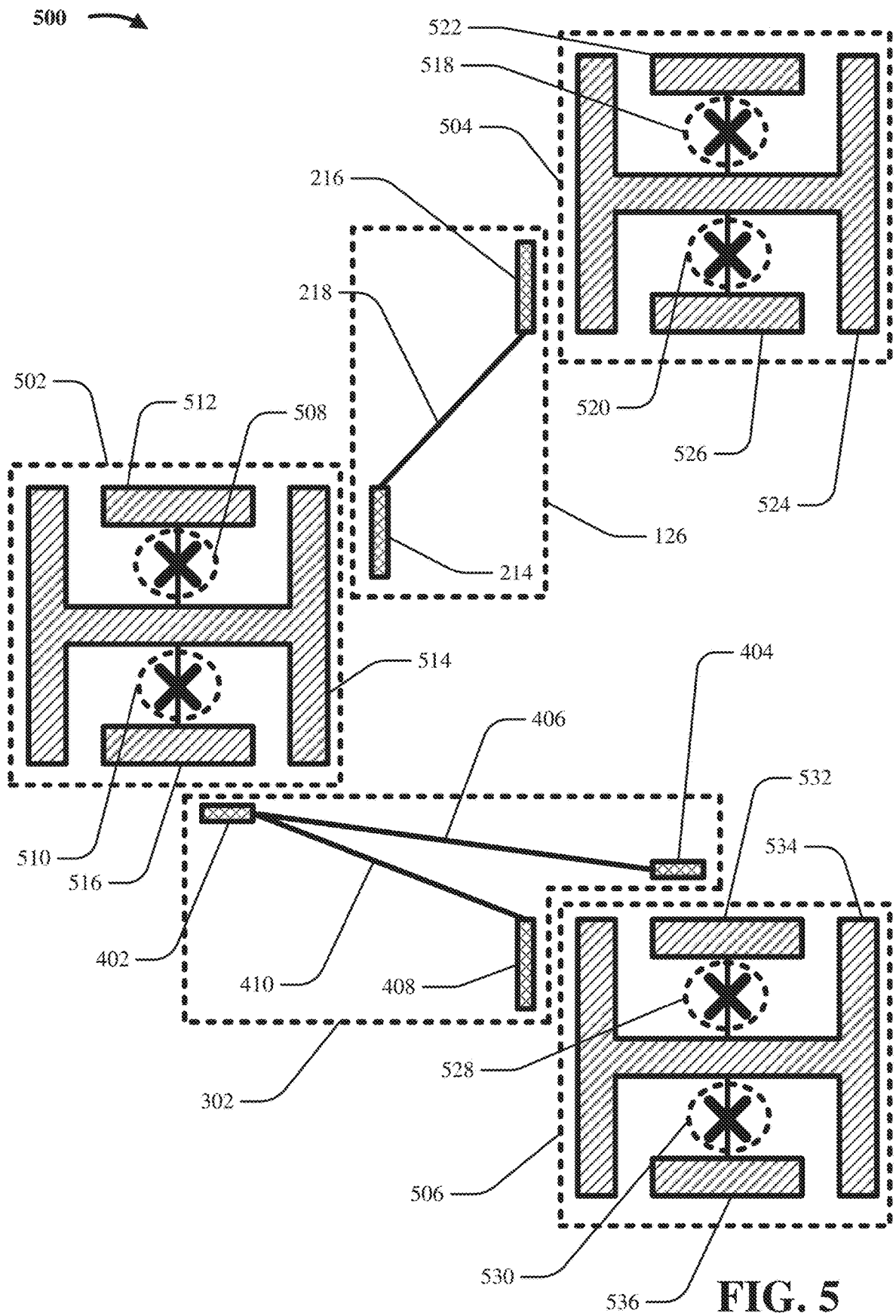
FIG. 5 illustrates a block diagram of an example, non-limiting system that facilitates mode-selective couplers for frequency collision reduction in accordance with one or more embodiments described herein.

FIG. 5 illustrates a block diagram of an example, non-limiting system 500 that can facilitate mode-selective couplers for frequency collision reduction in accordance with one or more embodiments described herein. In various aspects, FIG. 5 can illustrate how the first mode-selective coupler 126 and the second mode-selective coupler 302 can be implemented to couple together multiple target qubits to a control qubit so as to facilitate selective cross-resonance entanglement.

In various embodiments, the system 500 can comprise a control qubit 502, a first target qubit 504, and a second target qubit 506. In various aspects, the control qubit 502, the first target qubit 504, and the second target qubit 506 can be two-junction transmon qubits, as described above. That is, in various aspects, the control qubit 502 can comprise an end capacitor pad 512, a Josephson junction 508, a middle capacitor pad 514, a Josephson junction 510, and an end capacitor pad 516, all coupled together in series. Similarly, the first target qubit 504 can comprise an end capacitor pad 522, a Josephson junction 518, a middle capacitor pad 524, a Josephson junction 520, and an end capacitor pad 526, all coupled together in series. Similarly, the second target qubit 506 can comprise an end capacitor pad 532, a Josephson junction 528, a middle capacitor pad 534, a Josephson junction 530, and an end capacitor pad 536, all coupled together in series.

As mentioned above, because the first target qubit 504 is a two-junction transmon qubit, it can have both an A-mode transition frequency and a B-mode transition frequency. Similarly, because the second target qubit 506 is a two-junction transmon qubit, it can have both an A-mode transition frequency and a B-mode transition frequency.

In various cases, the first target qubit 504 and the second target qubit 506 can be degenerate. That is, in some cases, the A-mode transition frequency of the first target qubit 504 can be equal to the A-mode transition frequency of the second target qubit 506, and the B-mode transition frequency of the first target qubit 504 can be equal to the B-mode transition frequency of the second target qubit 506.

As shown, in various embodiments, the control qubit 502 can be coupled to the first target qubit 504 by the first mode-selective coupler 126. That is, the first mode-selective coupler 126 can capacitively couple the middle capacitor pad 514 to the middle capacitor pad 524. Also as shown, in various embodiments, the control qubit 502 can be coupled to the second target qubit 506 by the second mode-selective coupler 302. That is, the second mode-selective coupler 302 can capacitively couple the end capacitor pad 516 to the end capacitor pad 532 and can capacitively couple the end capacitor pad 516 to the middle capacitor pad 534. Because of the first mode-selective coupler 126, A-mode coupling can be facilitated between the control qubit 502 and the first target qubit 504, and B-mode coupling can be prevented between the control qubit 502 and the first target qubit 504. Similarly, because of the second mode-selective coupler 302, B-mode coupling can be facilitated between the control qubit 502 and the second target qubit 506, and A-mode coupling can be prevented between the control qubit 502 and the second target qubit 506.

In various embodiments, the system 500 can facilitate selective cross-resonance entanglement, notwithstanding the fact that the first target qubit 504 and the second target qubit 506 can be degenerate. Specifically, in various cases, the control qubit 502 can be driven by a microwave pulse and/or tone that has a frequency that is equal to the A-mode transition frequency of the first target qubit 504. Since the frequency of the microwave pulse and/or tone is equal to the A-mode transition frequency of the first target qubit 504 and since the first mode-selective coupler 126 can facilitate A-mode coupling between the control qubit 502 and the first target qubit 504, the control qubit 502 can become entangled with the first target qubit 504. Note that in such case, the control qubit 502 can avoid becoming entangled with the second target qubit 506. This is because, although the microwave pulse and/or tone has a frequency that is equal to the A-mode transition frequency of the second target qubit 506 (e.g., the first target qubit 504 and the second target qubit 506 can be degenerate), the second mode-selective coupler 302 can prevent A-mode coupling between the control qubit 502 and the second target qubit 506.

In various other cases, the control qubit 502 can be driven by a microwave pulse and/or tone that has a frequency that is equal to the B-mode transition frequency of the second target qubit 506. Since the frequency of the microwave pulse and/or tone is equal to the B-mode transition frequency of the second target qubit 506 and since the second mode-selective coupler 302 can facilitate B-mode coupling between the control qubit 502 and the second target qubit 506, the control qubit 502 can become entangled with the second target qubit 506. Note that in such case, the control qubit 502 can avoid becoming entangled with the first target qubit 504. This is because, although the microwave pulse and/or tone has a frequency that is equal to the B-mode transition frequency of the first target qubit 504 (e.g., the first target qubit 504 and the second target qubit 506 can be degenerate), the first mode-selective coupler 126 can prevent B-mode coupling between the control qubit 502 and the first target qubit 504.

Thus, as explained above, the first mode-selective coupler 126 and the second mode-selective coupler 302 can work in conjunction to facilitate selective cross-resonance entanglement, even with degenerate targets. Moreover, no magnetic fluxes and/or no decreased connectivity are required to facilitate such selective cross-resonance entanglement. As mentioned above, quantum computing lattices that employ only single-junction transmon qubits coupled by bus resonators cannot facilitate selective cross-resonance entanglement when degenerate targets are involved. This emphasizes the concrete and tangible technical benefits of various embodiments of the invention.

Figure 6:
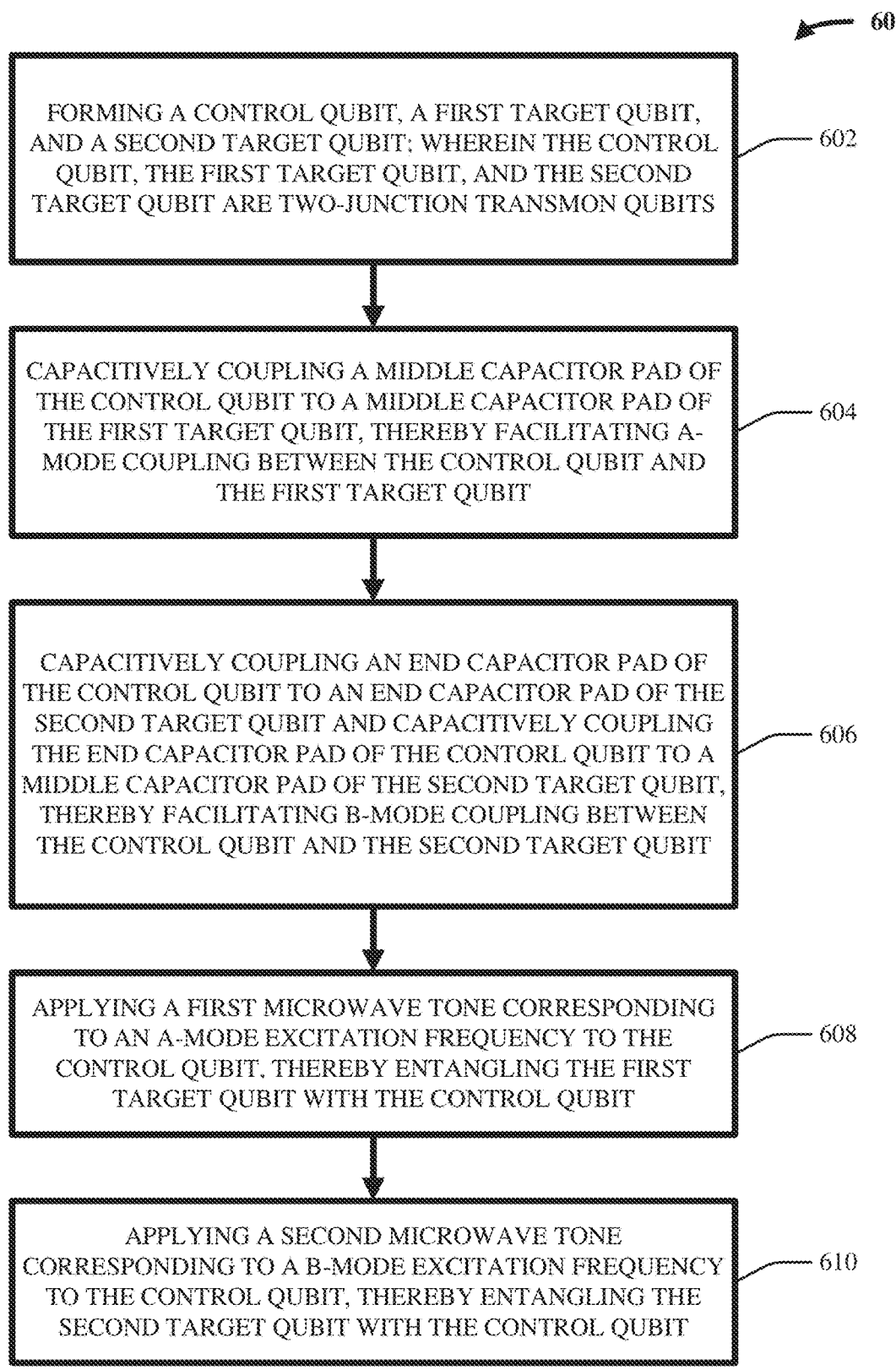
FIG. 6 illustrates a flow diagram of an example, non-limiting method that facilitates mode-selective couplers for frequency collision reduction in accordance with one or more embodiments described herein.

FIG. 6 illustrates a flow diagram of an example, non-limiting method 600 that can facilitate mode-selective couplers for frequency collision reduction in accordance with one or more embodiments described herein.

In various embodiments, act 602 can include forming a control qubit (e.g., 502), a first target qubit (e.g., 504), and a second target qubit (e.g., 506), wherein the control qubit, the first target qubit, and the second target qubit are two-junction transmon qubits. In various aspects, any suitable micro-fabrication and/or nano-fabrication technique can be used to form and/or manufacture the control qubit, the first target qubit, and the second target qubit. In various, aspects, the first target qubit and the second target qubit can be degenerate (e.g., can have the same A-mode transition frequency and the same B-mode transition frequency).

In various aspects, act 604 can include capacitively coupling a middle capacitor pad (e.g., 514) of the control qubit to a middle capacitor pad (e.g., 524) of the first target qubit, thereby facilitating A-mode coupling between the control qubit and the first target qubit.

In various instances, act 606 can include capacitively coupling an end capacitor pad (e.g., 516) of the control qubit to an end capacitor pad (e.g., 532) of the second target qubit, and capacitively coupling the same end capacitor pad of the control qubit to a middle capacitor pad (e.g., 534) of the second target qubit, thereby facilitating B-mode coupling between the control qubit and the second target qubit.

In various embodiments, act 608 can include applying a first microwave tone corresponding to an A-mode excitation frequency (e.g., A-mode transition frequency of the first target qubit 504) to the control qubit, thereby entangling the first target qubit with the control qubit.

In various embodiments, act 610 can include applying a second microwave tone corresponding to a B-mode excitation frequency (e.g., B-mode transition frequency of the second target qubit 506) to the control qubit, thereby entangling the second target qubit with the control qubit.

Figure 7:
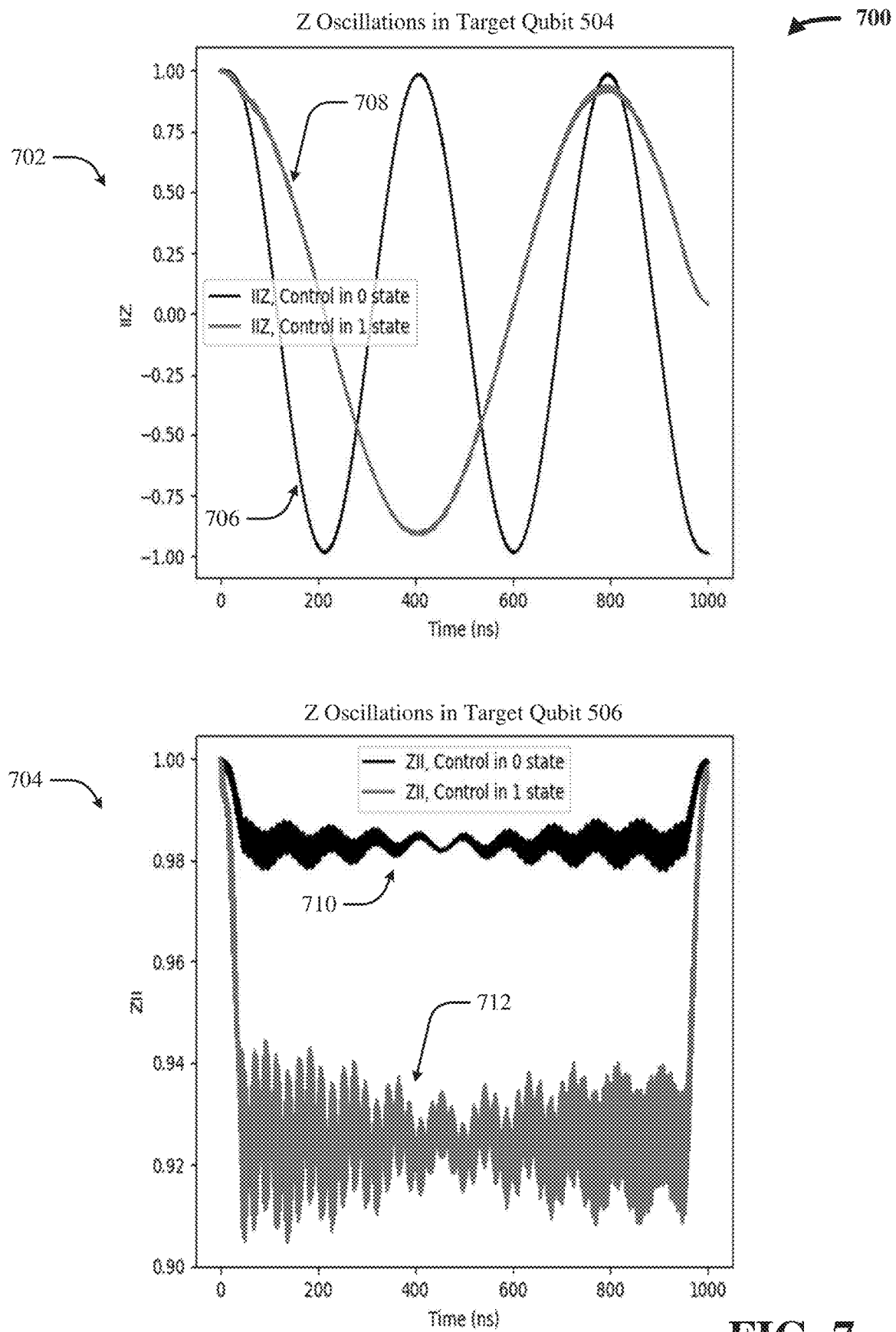
FIGS. 7-8 illustrate graphs of example, non-limiting simulation results of systems that facilitate mode-selective couplers for frequency collision reduction in accordance with one or more embodiments described herein.
Figure 8:
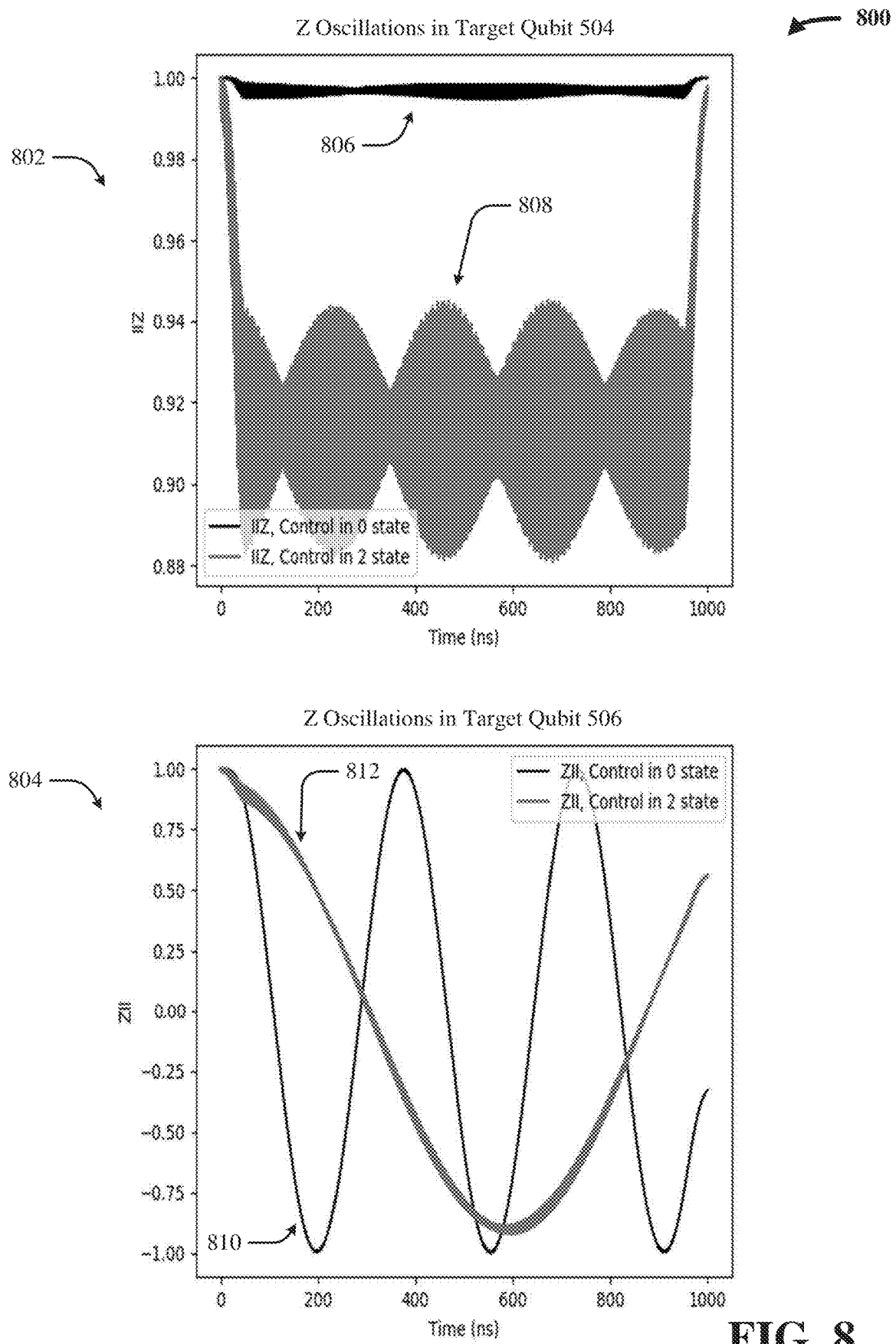

FIGS. 7-8 illustrate graphs of example, non-limiting simulation results of systems that can facilitate mode-selective couplers for frequency collision reduction in accordance with one or more embodiments described herein. In various aspects, FIGS. 7-8 illustrate the selective cross-resonance entanglement behavior of the system 500.

FIG. 7 depicts a graph 702 and a graph 704. In various aspects, the graph 702 can represent the oscillatory behavior (e.g., the Z-oscillations) of the first target qubit 504 when the control qubit 502 is driven by a microwave pulse and/or tone that has a frequency that matches the A-mode transition frequency of the first target qubit 504. In various aspects, the graph 704 can represent the oscillatory behavior (e.g., the Z-oscillations) of the second target qubit 506 when the control qubit 502 is driven by a microwave pulse and/or tone that has a frequency that matches the A-mode transition frequency of the first target qubit 504.

As shown in the graph 702, the first target qubit 504 experiences Rabi oscillations when the control qubit 502 is driven by a microwave pulse and/or tone that has a frequency that matches the A-mode transition frequency of the first target qubit 504. Specifically, the first target qubit 504 exhibits the oscillatory behavior 706 when the control qubit 502 is in a 0 state and driven by the microwave pulse and/or tone that matches the A-mode transition frequency of the first target qubit 504. Moreover, the first target qubit 504 exhibits the oscillatory behavior 708 when the control qubit 502 is in a 1 state and driven by the microwave pulse and/or tone that matches the A-mode transition frequency of the first target qubit 504.

As shown in the graph 704, the second target qubit 506 does not experience Rabi oscillations when the control qubit 502 is driven by a microwave pulse and/or tone that has a frequency that matches the A-mode transition frequency of the first target qubit 504. Specifically, the second target qubit 506 exhibits the oscillatory behavior 710 when the control qubit 502 is in a 0 state and driven by the microwave pulse and/or tone that matches the A-mode transition frequency of the first target qubit 504. Moreover, the second target qubit 506 exhibits the oscillatory behavior 712 when the control qubit 502 is in a 1 state and driven by the microwave pulse and/or tone that matches the A-mode transition frequency of the first target qubit 504.

Thus, as shown by the graphs 702 and 704, when the control qubit 502 is driven by a microwave pulse and/or tone that matches the A-mode transition frequency of the first target qubit 504, the first target qubit 504 can exhibit Rabi oscillations and the second target qubit 506 can exhibit non-Rabi oscillatory behavior. In other words, the first target qubit 504 can become entangled with the control qubit 502, and the second target qubit 506 can avoid becoming entangled with the control qubit 502. In various aspects, this selective cross-resonance entanglement is caused by the first mode-selective coupler 126 coupling the control qubit 502 to the first target qubit 504 and the second mode-selective coupler 302 coupling the control qubit 502 to the second target qubit 506. Moreover, this selective cross-resonance entanglement can be facilitated notwithstanding the fact that the first target qubit 504 and the second target qubit 506 can be degenerate.

FIG. 8 is similar to FIG. 7. FIG. 8 depicts a graph 802 and a graph 804. In various aspects, the graph 802 can represent the oscillatory behavior (e.g., the Z-oscillations) of the first target qubit 504 when the control qubit 502 is driven by a microwave pulse and/or tone that has a frequency that matches the B-mode transition frequency of the second target qubit 506. In various aspects, the graph 804 can represent the oscillatory behavior (e.g., the Z-oscillations) of the second target qubit 506 when the control qubit 502 is driven by a microwave pulse and/or tone that has a frequency that matches the B-mode transition frequency of the second target qubit 506.

As shown in the graph 802, the first target qubit 504 does not experience Rabi oscillations when the control qubit 502 is driven by a microwave pulse and/or tone that has a frequency that matches the B-mode transition frequency of the second target qubit 506. Specifically, the first target qubit 504 exhibits the oscillatory behavior 806 when the control qubit 502 is in a 0 state and driven by the microwave pulse and/or tone that matches the B-mode transition frequency of the second target qubit 506. Moreover, the first target qubit 504 exhibits the oscillatory behavior 808 when the control qubit 502 is in a 2 state and driven by the microwave pulse and/or tone that matches the B-mode transition frequency of the second target qubit 506.

As shown in the graph 804, the second target qubit 506 does experience Rabi oscillations when the control qubit 502 is driven by a microwave pulse and/or tone that has a frequency that matches the B-mode transition frequency of the second target qubit 506. Specifically, the second target qubit 506 exhibits the oscillatory behavior 810 when the control qubit 502 is in a 0 state and driven by the microwave pulse and/or tone that matches the B-mode transition frequency of the second target qubit 506. Moreover, the second target qubit 506 exhibits the oscillatory behavior 812 when the control qubit 502 is in a 2 state and driven by the microwave pulse and/or tone that matches the B-mode transition frequency of the second target qubit 506.

Thus, as shown by the graphs 802 and 804, when the control qubit 502 is driven by a microwave pulse and/or tone that matches the B-mode transition frequency of the second target qubit 506, the second target qubit 506 can exhibit Rabi oscillations and the first target qubit 504 can exhibit non-Rabi oscillatory behavior. In other words, the second target qubit 506 can become entangled with the control qubit 502, and the first target qubit 504 can avoid becoming entangled with the control qubit 502. In various aspects, this selective cross-resonance entanglement is caused by the first mode-selective coupler 126 coupling the control qubit 502 to the first target qubit 504 and the second mode-selective coupler 302 coupling the control qubit 502 to the second target qubit 506. Moreover, this selective cross-resonance entanglement can be facilitated notwithstanding the fact that the first target qubit 504 and the second target qubit 506 can be degenerate.

Figure 9:
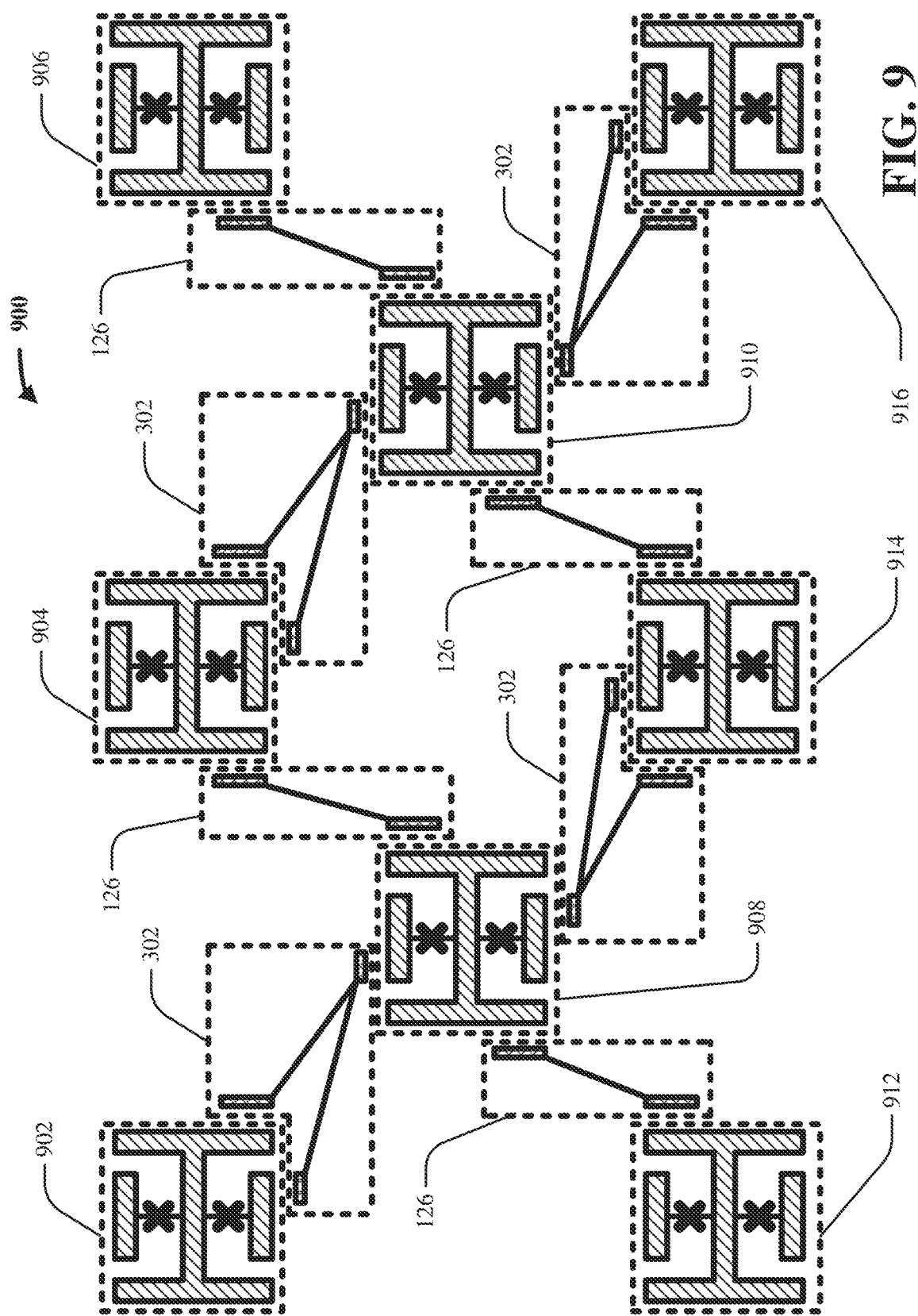
FIG. 9 illustrates a block diagram of an example, non-limiting quantum computing lattice that facilitates mode-selective couplers for frequency collision reduction in accordance with one or more embodiments described herein.

FIG. 9 illustrates a block diagram of an example, non-limiting quantum computing lattice 900 that can facilitate mode-selective couplers for frequency collision reduction in accordance with one or more embodiments described herein. In various aspects, FIG. 9 can illustrate how the first mode-selective coupler 126 and the second mode-selective coupler 302 can be implemented throughout a quantum computing lattice to facilitate selective cross-resonance entanglement.

In various embodiments, the quantum computing lattice 900 can comprise two-junction transmon qubits 902, 904, 906, 908, 910, 912, 914, and 916. In various aspects, the two-junction transmon qubits 902, 904, 906, 908, 910, 912, 914, and 916 can be structured as described above with respect to the two-junction transmon qubit 102 and/or the two-junction transmon qubit 104.

In various aspects, as shown, the two-junction transmon qubit 908 can be coupled to its neighboring qubits: that is, two-junction transmon qubits 902, 904, 912, and 914. Specifically, the two-junction transmon qubit 908 can be coupled to the two-junction transmon qubit 902 by a second mode-selective coupler 302, the two-junction transmon qubit 908 can be coupled to the two-junction transmon qubit 904 by a first mode-selective coupler 126, the two-junction transmon qubit 908 can be coupled to the two-junction transmon qubit 914 by a second mode-selective coupler 302, and the two-junction transmon qubit 908 can be coupled to the two-junction transmon qubit 912 by a first mode-selective coupler 126. Thus, B-mode coupling can be facilitated between the two-junction transmon qubit 908 and the two-junction transmon qubit 902, A-mode coupling can be facilitated between the two-junction transmon qubit 908 and the two-junction transmon qubit 904, B-mode coupling can be facilitated between the two-junction transmon qubit 908 and the two-junction transmon qubit 914, and A-mode coupling can be facilitated between the two-junction transmon qubit 908 and the two-junction transmon qubit 912. Similarly, the two-junction transmon qubit 910 can be coupled to the two-junction transmon qubit 904 by a second mode-selective coupler 302, the two-junction transmon qubit 910 can be coupled to the two-junction transmon qubit 906 by a first mode-selective coupler 126, the two-junction transmon qubit 910 can be coupled to the two-junction transmon qubit 916 by a second mode-selective coupler 302, and the two-junction transmon qubit 910 can be coupled to the two-junction transmon qubit 914 by a first mode-selective coupler 126. Thus, B-mode coupling can be facilitated between the two-junction transmon qubit 910 and the two-junction transmon qubit 904, A-mode coupling can be facilitated between the two-junction transmon qubit 910 and the two-junction transmon qubit 906, B-mode coupling can be facilitated between the two-junction transmon qubit 910 and the two-junction transmon qubit 916, and A-mode coupling can be facilitated between the two-junction transmon qubit 910 and the two-junction transmon qubit 914.

In various aspects, the two-junction transmon qubit 908 can be considered a control qubit with four target qubits: the two-junction transmon qubits 902, 904, 912, and 914. Similarly, in various aspects, the two-junction transmon qubit 910 can be considered a control qubit with four target qubits: the two-junction transmon qubits 904, 906, 914, and 916.

In various aspects, the two-junction transmon qubits 902, 904, and 906 can be degenerate. In various aspects, the two-junction transmon qubits 908 and 910 can be degenerate. In various aspects, the two-junction transmon qubits 912, 914, and 916 can be degenerate. That is, in various instances, the quantum computing lattice 900 can comprise three distinct sets of superconducting qubits, rather than five distinct sets. In various aspects, when the first mode-selective coupler 126 and the second mode-selective coupler 302 are implemented, such three distinct sets of superconducting qubits can be sufficient to facilitate selective cross-resonance entanglement.

Consider the following example. Suppose that the two-junction transmon qubit 908 is driven with a microwave tone and/or pulse that matches the A-mode transition frequency of the two-junction transmon qubit 904. In such case, because the microwave tone and/or pulse matches the A-mode transition frequency of the two-junction transmon qubit 904, and because the two-junction transmon qubit 908 is coupled to the two-junction transmon qubit 904 by the first mode-selective coupler 126, the two-junction transmon qubit 904 can become entangled with the two-junction transmon qubit 908. Note that the two-junction transmon qubit 902 can avoid becoming entangled with the two-junction transmon qubit 908 in such case. After all, the two-junction transmon qubit 908 is coupled to the two-junction transmon qubit 902 by the second mode-selective coupler 302, which can prevent A-mode coupling between the two-junction transmon qubit 908 and the two-junction transmon qubit 902. Moreover, note that the two-junction transmon qubits 912 and 914 can also avoid becoming entangled with the two-junction transmon qubit 908 in such case. After all, the microwave pulse and/or tone has a frequency that does not match either the A-mode transition frequency or the B-mode transition frequency of the two-junction transmon qubits 912 and 914 (e.g., the two-junction transmon qubits 912 and 914 can be non-degenerate with the two-junction transmon qubits 902 and 904).

Suppose that the two-junction transmon qubit 908 is instead driven with a microwave tone and/or pulse that matches the B-mode transition frequency of the two-junction transmon qubit 902. In such case, because the microwave tone and/or pulse matches the B-mode transition frequency of the two-junction transmon qubit 902, and because the two-junction transmon qubit 908 is coupled to the two-junction transmon qubit 902 by the second mode-selective coupler 302, the two-junction transmon qubit 902 can become entangled with the two-junction transmon qubit 908. Note that the two-junction transmon qubit 904 can avoid becoming entangled with the two-junction transmon qubit 908 in such case. After all, the two-junction transmon qubit 908 is coupled to the two-junction transmon qubit 904 by the first mode-selective coupler 126, which can prevent B-mode coupling between the two-junction transmon qubit 908 and the two-junction transmon qubit 904. Moreover, note that the two-junction transmon qubits 912 and 914 can also avoid becoming entangled with the two-junction transmon qubit 908 in such case. After all, the microwave pulse and/or tone has a frequency that does not match either the A-mode transition frequency or the B-mode transition frequency of the two-junction transmon qubits 912 and 914 (e.g., the two-junction transmon qubits 912 and 914 can be non-degenerate with the two-junction transmon qubits 902 and 904).

Suppose that the two-junction transmon qubit 908 is instead driven with a microwave tone and/or pulse that matches the A-mode transition frequency of the two-junction transmon qubit 912. In such case, because the microwave tone and/or pulse matches the A-mode transition frequency of the two-junction transmon qubit 912, and because the two-junction transmon qubit 908 is coupled to the two-junction transmon qubit 912 by the first mode-selective coupler 126, the two-junction transmon qubit 912 can become entangled with the two-junction transmon qubit 908. Note that the two-junction transmon qubit 914 can avoid becoming entangled with the two-junction transmon qubit 908 in such case. After all, the two-junction transmon qubit 908 is coupled to the two-junction transmon qubit 914 by the second mode-selective coupler 302, which can prevent A-mode coupling between the two-junction transmon qubit 908 and the two-junction transmon qubit 914. Moreover, note that the two-junction transmon qubits 902 and 904 can also avoid becoming entangled with the two-junction transmon qubit 908 in such case. After all, the microwave pulse and/or tone has a frequency that does not match either the A-mode transition frequency or the B-mode transition frequency of the two-junction transmon qubits 902 and 904 (e.g., the two-junction transmon qubits 912 and 914 can be non-degenerate with the two-junction transmon qubits 902 and 904).

Suppose that the two-junction transmon qubit 908 is instead driven with a microwave tone and/or pulse that matches the B-mode transition frequency of the two-junction transmon qubit 914. In such case, because the microwave tone and/or pulse matches the B-mode transition frequency of the two-junction transmon qubit 914, and because the two-junction transmon qubit 908 is coupled to the two-junction transmon qubit 914 by the second mode-selective coupler 302, the two-junction transmon qubit 914 can become entangled with the two-junction transmon qubit 908. Note that the two-junction transmon qubit 912 can avoid becoming entangled with the two-junction transmon qubit 908 in such case. After all, the two-junction transmon qubit 908 is coupled to the two-junction transmon qubit 912 by the first mode-selective coupler 126, which can prevent B-mode coupling between the two-junction transmon qubit 908 and the two-junction transmon qubit 912. Moreover, note that the two-junction transmon qubits 902 and 904 can also avoid becoming entangled with the two-junction transmon qubit 908 in such case. After all, the microwave pulse and/or tone has a frequency that does not match either the A-mode transition frequency or the B-mode transition frequency of the two-junction transmon qubits 902 and 904 (e.g., the two-junction transmon qubits 912 and 914 can be non-degenerate with the two-junction transmon qubits 902 and 904).

Thus, as shown by the above non-limiting, illustrative example, selective cross-resonance entanglement can be facilitated in the quantum computing lattice 900 with as few as three distinct sets of superconducting qubits (e.g., a first set of degenerate two-junction transmon qubits 902, 904, and 906; a second set of degenerate two-junction transmon qubits 908 and 910; and a third set of degenerate two-junction transmon qubits 912, 914, and 916). Because fewer distinct sets of superconducting qubits can be needed to facilitate selective cross-resonance entanglement compared to the usual five distinct sets, various embodiments of the invention can reduce a statistical probability of target-based frequency collisions occurring in the quantum computing lattice 900.

In various aspects, the quantum computing lattice 900 can include any suitable number of superconducting qubits, and/or can be arranged in any suitable shape and/or fashion. In various aspects, the quantum computing lattice 900 can be fabricated by any suitable nano-fabrication and/or micro-fabrication technique on any suitable quantum computing substrate (e.g., silicon substrate).

Figure 10:
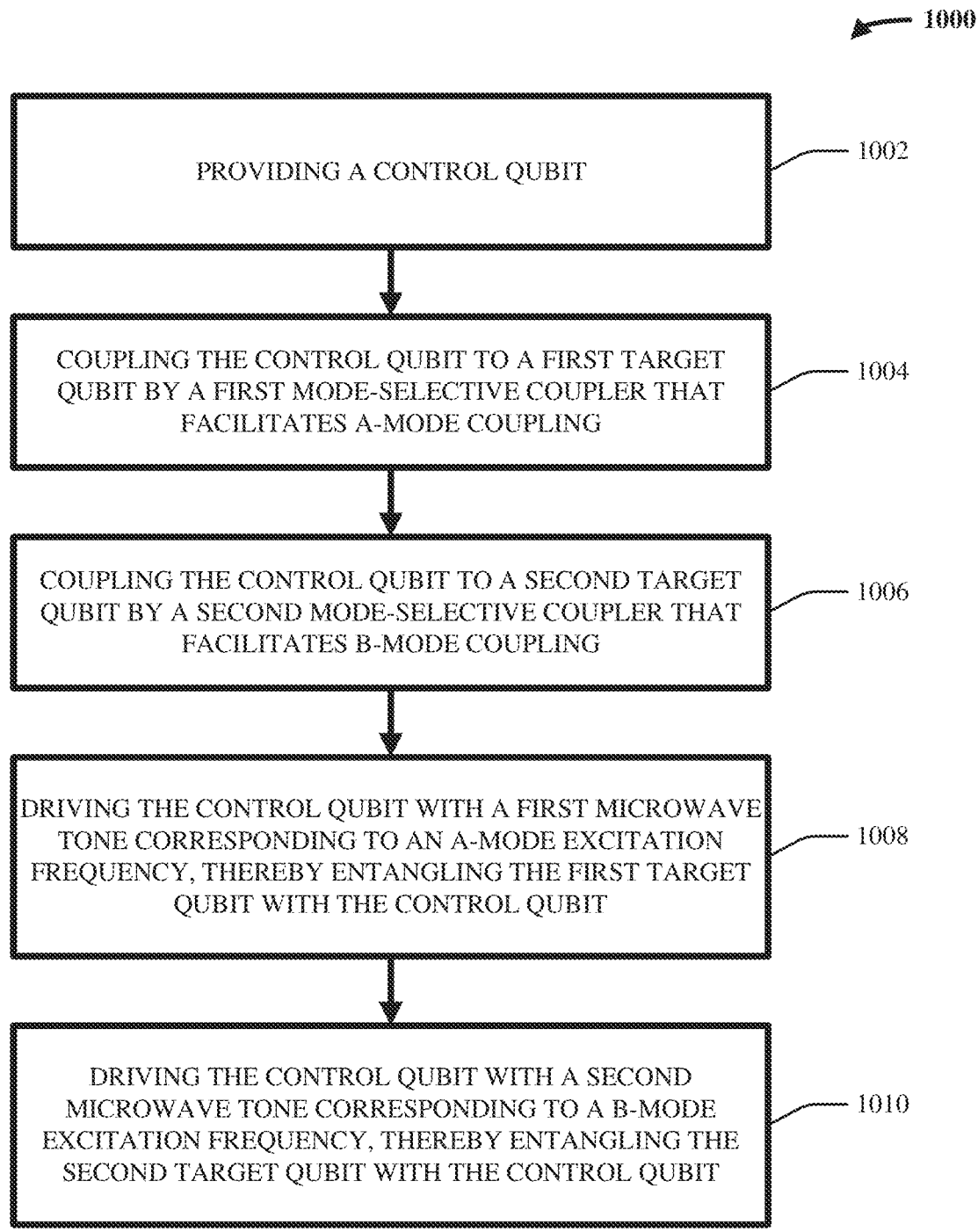
FIG. 10 illustrates a flow diagram of an example, non-limiting method that facilitates mode-selective couplers for frequency collision reduction in accordance with one or more embodiments described herein.

FIG. 10 illustrates a flow diagram of an example, non-limiting method 1000 that can facilitate mode-selective couplers for frequency collision reduction in accordance with one or more embodiments described herein.

In various embodiments, act 1002 can include providing a control qubit (e.g., 502). In various cases, such providing can be facilitated by any suitable micro-fabrication and/or nano-fabrication technique. In various cases, the control qubit can be provided on any suitable quantum computing substrate.

In various instances, act 1004 can include coupling the control qubit to a first target qubit (e.g., 504) by a first mode-selective coupler (e.g., 126) that facilitates A-mode coupling.

In various aspects, act 1006 can include coupling the control qubit to a second target qubit (e.g., 506) by a second mode-selective coupler (e.g., 302) that facilitates B-mode coupling.

In various embodiments, act 1008 can include driving the control qubit with a first microwave tone corresponding to an A-mode excitation frequency (e.g., an A-mode transition frequency of the first target qubit 504), thereby entangling the first target qubit with the control qubit.

In various instances, act 1010 can include driving the control qubit with a second microwave tone corresponding to a B-mode excitation frequency (e.g., a B-mode transition frequency of the second target qubit 506), thereby entangling the second target qubit with the control qubit.

As described herein, various embodiments of the invention can provide mode-selective coupling between two-junction transmon qubits in a quantum computing lattice, which can allow even degenerate targets to be driven independently with a cross-resonance gate. By implementing mode-selective couplers as described herein, various embodiments of the invention can create a nearest-neighbor-connected quantum computing lattice using as few as three distinct sets of superconducting qubits, rather than the usual five distinct sets of superconducting qubits. This reduction in the number of distinct sets of qubits can reduce a probability and/or prevalence of target-based frequency collisions occurring in the quantum computing lattice. In various aspects, suppression and/or reduction of target-based frequency collisions can allow increased production yield of multi-qubit devices and reduced levels of cross-talk among qubits.

In various aspects, embodiments of the invention can be implemented in any suitable quantum computing lattice that employs any suitable level of lattice connectivity. For example, in some cases, a next-nearest-neighbor-connection quantum computing lattice can be considered, in which all non-perimetral qubits are coupled to eight neighboring qubits. In such case, embodiments of the invention can facilitate selective cross-resonance entanglement with as few as five distinct sets of qubits, rather than the usual nine distinct sets when next-nearest-neighbor connections are included.

In various aspects, embodiments of the invention can reduce target-based frequency collisions in a square lattice of tunable coupler qubits ("TCQs") through mode-selective coupling between the TCQs. The mode-selective coupling can, in various aspects, permit the cross-resonance entangling gate to be driven between one type of excitation mode.

In various aspects, a method of suppressing qubit collisions in a lattice of qubits can comprise providing tunable coupler qubits ("TCQs") having at least two junctions arranged in any suitable lattice configuration. The method can further comprise coupling a TCQ within the lattice to two neighboring TCQs of the lattice via a first type of mode-selective coupling. The method can further comprise coupling the TCQ within the lattice to two other neighboring TCQs of the lattice via a second type of mode-selective coupling. In various aspects, the first and second type of mode-selective couplings can reduce a set of qubit frequencies required to avoid target-based frequency collisions.

Figure 11:
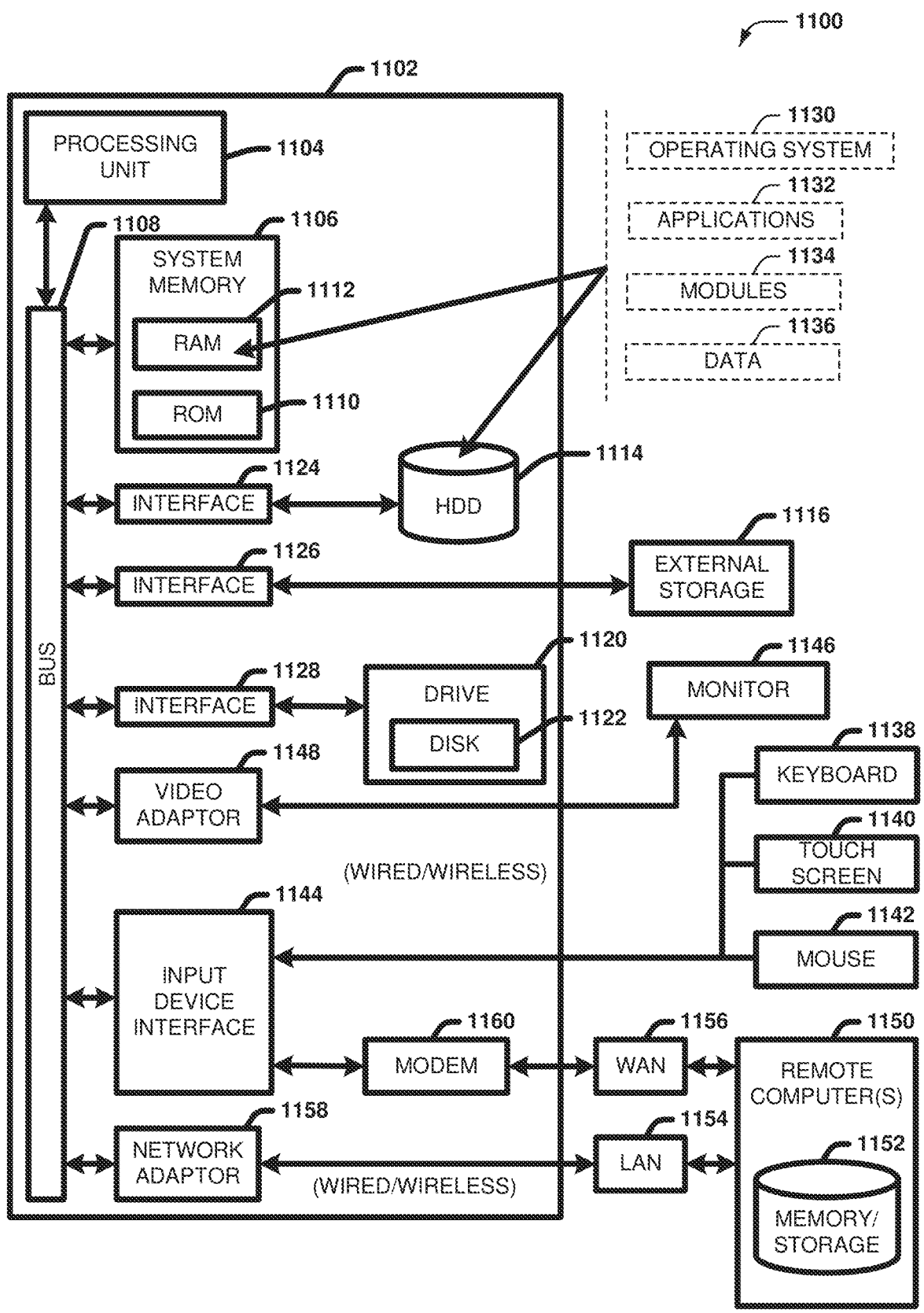
FIG. 11 illustrates a block diagram of an example, non-limiting operating environment in which one or more embodiments described herein can be facilitated.

In order to provide additional context for various embodiments described herein, FIG. 11 and the following discussion are intended to provide a general description of a suitable computing environment 1100 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 11, the example environment 1100 for implementing various embodiments of the aspects described herein includes a computer 1102, the computer 1102 including a processing unit 1104, a system memory 1106 and a system bus 1108. The system bus 1108 couples system components including, but not limited to, the system memory 1106 to the processing unit 1104. The processing unit 1104 can be any of various commercially available processors. Dual microprocessors and other multi-processor architectures can also be employed as the processing unit 1104.

The system bus 1108 can be any of several types of bus structure that can further interconnect to a memory bus (with or without a memory controller), a peripheral bus, and a local bus using any of a variety of commercially available bus architectures. The system memory 1106 includes ROM 1110 and RAM 1112. A basic input/output system (BIOS) can be stored in a non-volatile memory such as ROM, erasable programmable read only memory (EPROM), EEPROM, which BIOS contains the basic routines that help to transfer information between elements within the computer 1102, such as during startup. The RAM 1112 can also include a high-speed RAM such as static RAM for caching data.

The computer 1102 further includes an internal hard disk drive (HDD) 1114 (e.g., EIDE, SATA), one or more external storage devices 1116 (e.g., a magnetic floppy disk drive (FDD) 1116, a memory stick or flash drive reader, a memory card reader, etc.) and a drive 1120, e.g., such as a solid state drive, an optical disk drive, which can read or write from a disk 1122, such as a CD-ROM disc, a DVD, a BD, etc. Alternatively, where a solid state drive is involved, disk 1122 would not be included, unless separate. While the internal HDD 1114 is illustrated as located within the computer 1102, the internal HDD 1114 can also be configured for external use in a suitable chassis (not shown). Additionally, while not shown in environment 1100, a solid state drive (SSD) could be used in addition to, or in place of, an HDD 1114. The HDD 1114, external storage device(s) 1116 and drive 1120 can be connected to the system bus 1108 by an HDD interface 1124, an external storage interface 1126 and a drive interface 1128, respectively. The interface 1124 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1102, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1112, including an operating system 1130, one or more application programs 1132, other program modules 1134 and program data 1136. All or portions of the operating system, applications, modules, and/or data can also be cached in the RAM 1112. The systems and methods described herein can be implemented utilizing various commercially available operating systems or combinations of operating systems.

Computer 1102 can optionally comprise emulation technologies. For example, a hypervisor (not shown) or other intermediary can emulate a hardware environment for operating system 1130, and the emulated hardware can optionally be different from the hardware illustrated in FIG. 11. In such an embodiment, operating system 1130 can comprise one virtual machine (VM) of multiple VMs hosted at computer 1102. Furthermore, operating system 1130 can provide runtime environments, such as the Java runtime environment or the .NET framework, for applications 1132. Runtime environments are consistent execution environments that allow applications 1132 to run on any operating system that includes the runtime environment. Similarly, operating system 1130 can support containers, and applications 1132 can be in the form of containers, which are lightweight, standalone, executable packages of software that include, e.g., code, runtime, system tools, system libraries and settings for an application.

Further, computer 1102 can be enable with a security module, such as a trusted processing module (TPM). For instance with a TPM, boot components hash next in time boot components, and wait for a match of results to secured values, before loading a next boot component. This process can take place at any layer in the code execution stack of computer 1102, e.g., applied at the application execution level or at the operating system (OS) kernel level, thereby enabling security at any level of code execution.

A user can enter commands and information into the computer 1102 through one or more wired/wireless input devices, e.g., a keyboard 1138, a touch screen 1140, and a pointing device, such as a mouse 1142. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1104 through an input device interface 1144 that can be coupled to the system bus 1108, but can be connected by other interfaces, such as a parallel port, an IEEE 1394 serial port, a game port, a USB port, an IR interface, a BLUETOOTH® interface, etc.

A monitor 1146 or other type of display device can be also connected to the system bus 1108 via an interface, such as a video adapter 1148. In addition to the monitor 1146, a computer typically includes other peripheral output devices (not shown), such as speakers, printers, etc.

The computer 1102 can operate in a networked environment using logical connections via wired and/or wireless communications to one or more remote computers, such as a remote computer(s) 1150. The remote computer(s) 1150 can be a workstation, a server computer, a router, a personal computer, portable computer, microprocessor-based entertainment appliance, a peer device or other common network node, and typically includes many or all of the elements described relative to the computer 1102, although, for purposes of brevity, only a memory/storage device 1152 is illustrated. The logical connections depicted include wired/wireless connectivity to a local area network (LAN) 1154 and/or larger networks, e.g., a wide area network (WAN) 1156. Such LAN and WAN networking environments are commonplace in offices and companies, and facilitate enterprise-wide computer networks, such as intranets, all of which can connect to a global communications network, e.g., the Internet.

When used in a LAN networking environment, the computer 1102 can be connected to the local network 1154 through a wired and/or wireless communication network interface or adapter 1158. The adapter 1158 can facilitate wired or wireless communication to the LAN 1154, which can also include a wireless access point (AP) disposed thereon for communicating with the adapter 1158 in a wireless mode.

When used in a WAN networking environment, the computer 1102 can include a modem 1160 or can be connected to a communications server on the WAN 1156 via other means for establishing communications over the WAN 1156, such as by way of the Internet. The modem 1160, which can be internal or external and a wired or wireless device, can be connected to the system bus 1108 via the input device interface 1144. In a networked environment, program modules depicted relative to the computer 1102 or portions thereof, can be stored in the remote memory/storage device 1152. It will be appreciated that the network connections shown are example and other means of establishing a communications link between the computers can be used.

When used in either a LAN or WAN networking environment, the computer 1102 can access cloud storage systems or other network-based storage systems in addition to, or in place of, external storage devices 1116 as described above, such as but not limited to a network virtual machine providing one or more aspects of storage or processing of information. Generally, a connection between the computer 1102 and a cloud storage system can be established over a LAN 1154 or WAN 1156 e.g., by the adapter 1158 or modem 1160, respectively. Upon connecting the computer 1102 to an associated cloud storage system, the external storage interface 1126 can, with the aid of the adapter 1158 and/or modem 1160, manage storage provided by the cloud storage system as it would other types of external storage. For instance, the external storage interface 1126 can be configured to provide access to cloud storage sources as if those sources were physically connected to the computer 1102.

The computer 1102 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a control qubit coupled to a first mode-selective coupler and a second mode-selective coupler;
a first target qubit coupled to the first mode-selective coupler, wherein the first mode-selective coupler allows A-mode coupling between the control qubit and the first target qubit, and prevents B-mode coupling between the control qubit and the first target qubit; and
a second target qubit coupled to the second mode-selective coupler, wherein the second mode-selective coupler allows the B-mode coupling between the control qubit and the second target qubit, and prevents the A-mode coupling between the control qubit and the second target qubit.

2. The device of claim 1, wherein the control qubit, the first target qubit, and the second target qubit are two-junction transmon qubits.

3. The device of claim 2, wherein the first mode-selective coupler comprises a capacitor that capacitively couples a middle capacitor pad of the control qubit to a middle capacitor pad of the first target qubit.

4. The device of claim 3, wherein the capacitor has a capacitance that is less than shunting capacitance values of the control qubit and less than shunting capacitance values of the first target qubit.

5. The device of claim 2, wherein the second mode-selective coupler comprises a first capacitor that capacitively couples an end capacitor pad of the control qubit to an end capacitor pad of the second target qubit and comprises a second capacitor that capacitively couples the end capacitor pad of the control qubit to a middle capacitor pad of the second target qubit.

6. The device of claim 5, wherein the first capacitor has a first capacitance that is less than shunting capacitance values of the control qubit and less than shunting capacitance values of the second target qubit, and wherein the second capacitor has a second capacitance that is half the first capacitance.

7. The device of claim 1, wherein the first target qubit and the second target qubit are degenerate targets.

8. The device of claim 7, wherein the first target qubit entangles with the control qubit when the control qubit is driven by a first microwave tone corresponding to an A-mode excitation frequency of the degenerate targets, and wherein the second target qubit entangles with the control qubit when the control qubit is driven by a second microwave tone corresponding to a B-mode excitation frequency of the degenerate targets.

9. A method, comprising:
providing a control qubit;
coupling the control qubit to a first target qubit by a first mode-selective coupler that allows A-mode coupling between the control qubit and the first target qubit, and prevents B-mode coupling between the control qubit and the first target qubit; and
coupling the control qubit to a second target qubit by a second mode-selective coupler that allows the B-mode coupling between the control qubit and the second target qubit, and prevents the A-mode coupling between the control qubit and the second target qubit, wherein the second mode-selective coupler couples an end capacitor pad of the control qubit to a middle capacitor pad of the second target qubit.

10. The method of claim 9, wherein the control qubit, the first target qubit, and the second target qubit are two-junction transmon qubits.

11. The method of claim 10, wherein the first mode-selective coupler comprises a capacitor that capacitively couples a middle capacitor pad of the control qubit to a middle capacitor pad of the first target qubit.

12. The method of claim 11, wherein the capacitor has a capacitance that is less than shunting capacitance values of the control qubit and less than shunting capacitance values of the first target qubit.

13. The method of claim 10, wherein the second mode-selective coupler comprises a first capacitor that capacitively couples an end capacitor pad of the control qubit to an end capacitor pad of the second target qubit and comprises a second capacitor that capacitively couples the end capacitor pad of the control qubit to a middle capacitor pad of the second target qubit.

14. The method of claim 13, wherein the first capacitor has a first capacitance that is less than shunting capacitance values of the control qubit and less than shunting capacitance values of the second target qubit, and wherein the second capacitor has a second capacitance that is half the first capacitance.

15. The method of claim 9, wherein the first target qubit and the second target qubit are degenerate targets.

16. The method of claim 15, further comprising:
driving the control qubit with a first microwave tone corresponding to an A-mode excitation frequency of the degenerate targets, thereby entangling the first target qubit with the control qubit; and
driving the control qubit with a second microwave tone corresponding to a B-mode excitation frequency of the degenerate targets, thereby entangling the second target qubit with the control qubit.

17. An apparatus, comprising:
a control qubit;
a first mode-selective coupler that allows A-mode coupling between the control qubit and a first target qubit, and prevents B-mode coupling between the control qubit and the first target qubit; and
a second mode-selective coupler that allows the B-mode coupling between the control qubit and a second target qubit, and prevents the A-mode coupling between the control qubit and the second target qubit, wherein the second mode-selective coupler couples an end capacitor pad of the control qubit to a middle capacitor pad of the second target qubit.

18. The apparatus of claim 17, wherein the first mode-selective coupler comprises a capacitor that couples a middle capacitor pad of the control qubit to a middle capacitor pad of the first target qubit, wherein a capacitance of the capacitor is less than shunting capacitance values of the control qubit and less than shunting capacitance values of the second target qubit.

19. The apparatus of claim 17, wherein the second mode-selective coupler comprises a first capacitor that couples an end capacitor pad of the control qubit to an end capacitor pad of the second target qubit and comprises a second capacitor that couples the end capacitor pad of the control qubit to a middle capacitor pad of the second target qubit, wherein a first capacitance of the first capacitor is less than shunting capacitance values of the control qubit and less than shunting capacitance values of the second target qubit, and wherein a second capacitance of the second capacitor is half the first capacitance.

20. The apparatus of claim 17, wherein the first target qubit and the second target qubit are degenerate targets, wherein the first target qubit entangles with the control qubit when the control qubit is driven by a first microwave tone corresponding to an A-mode excitation frequency of the degenerate targets, and wherein the second target qubit entangles with the control qubit when the control qubit is driven by a second microwave tone corresponding to a B-mode excitation frequency of the degenerate targets.

* * * * *